United States Patent
James et al.

(10) Patent No.: US 9,715,566 B2
(45) Date of Patent: Jul. 25, 2017

(54) COMPUTER IMPLEMENTED SYSTEM AND METHOD OF TRANSLATION OF VERIFICATION COMMANDS OF AN ELECTRONIC DESIGN

(71) Applicant: Zipalog, Inc., Plano, TX (US)

(72) Inventors: Felicia James, Carrollton, TX (US); Michael Krasnicki, Richardson, TX (US); Xiyuan Wu, Dallas, TX (US)

(73) Assignee: Zipalog, Inc., Plano, TX (US)

( * ) Notice: Subject to any disclaimer, the term of this patent is extended or adjusted under 35 U.S.C. 154(b) by 111 days.

(21) Appl. No.: 14/707,689

(22) Filed: May 8, 2015

(65) Prior Publication Data
US 2015/0324505 A1    Nov. 12, 2015

Related U.S. Application Data

(60) Provisional application No. 61/991,072, filed on May 9, 2014.

(51) Int. Cl.
*G06F 17/50*    (2006.01)

(52) U.S. Cl.
CPC ...... *G06F 17/5063* (2013.01); *G06F 17/5022* (2013.01); *G06F 17/5036* (2013.01); *G06F 17/5045* (2013.01)

(58) Field of Classification Search
CPC ..................................................... G06F 17/50
USPC ....................................................... 716/103
See application file for complete search history.

(56) References Cited

U.S. PATENT DOCUMENTS

| | | |
|---|---|---|
| 8,296,699 B1 | 10/2012 | Chetput et al. |
| 8,612,908 B2 | 12/2013 | Cooper et al. |
| 2003/0125920 A1* | 7/2003 | Matsuoka ............. G06F 17/504 703/15 |
| 2003/0212967 A1 | 11/2003 | Halstead |
| 2008/0250362 A1 | 10/2008 | Darringer et al. |
| 2009/0064064 A1* | 3/2009 | Eisner ................... G06F 17/504 716/106 |
| 2009/0150857 A1 | 6/2009 | Srinivasan et al. |
| 2014/0126665 A1 | 5/2014 | Lee |

OTHER PUBLICATIONS

Kim, et al. VPC Prediction: Reducing the Cost of Indirect Branches via Hardware-Based Dynamic Devirtualization. ISCA 2007. Jun. 2007. [retrieved on Sep. 2, 2015] Retrieved from the Internet: <http://users.ece.cmu.edu/~omutlu/pub/kim_isca07.pdf>. entire document.
PCT: International Search Report and Written Opinion of PCT/US2015/030133 (related application), Sep. 30, 2015, 20 pgs.
PCT: International Preliminary Report on Patentability of PCT/US2015/030133 (related application), Nov. 24, 2016; 13 pgs.

* cited by examiner

*Primary Examiner* — Thuan Do
(74) *Attorney, Agent, or Firm* — Howison & Arnott, LLP

(57) ABSTRACT

A computer implemented method of translation of verification commands of an electronic design, comprises the steps of receiving the electronic design, receiving at least one analog test harness model having at least one indirect branch contribution statement, translating the at least one indirect branch contribution statement into a plurality of direct branch contribution operators based at least in part upon the at least one analog test harness model and generating a netlist based at least in part upon the translation.

31 Claims, 21 Drawing Sheets

COMPUTER IMPLEMENTED SYSTEM AND METHOD OF TRANSLATION OF VERIFICATION COMMANDS OF AN ELECTRONIC DESIGN

CROSS-REFERENCE TO RELATED APPLICATIONS

This application claims benefit of U.S. Provisional App. No. 61/991,072, filed May 9, 2014, entitled COMPUTER IMPLEMENTED SYSTEM AND METHOD OF TRANSLATION OF VERIFICATION COMMANDS OF AN ELECTRONIC DESIGN, the specification of which is incorporated herein in its entirety.

BACKGROUND

The method and system are generally related to the verification of analog and mixed signal integrated circuits and more specifically to a system and method to translate verification subroutine commands.

Electronic design automation (EDA) is software for designing electronic blocks. There are several broad types of electronic signals, components and blocks: digital, analog and a mixture of digital and analog termed mixed signal. The electronic design generally comprises at least one of the following levels of circuit information: a system level, an architectural level, a dataflow level, an electrical level, a device level and a technology level and the like.

Digital signals have discrete input and output values "0" and "1", occurring at discrete time values, typically tied to a clock signal. Digital components which input and output the digital signals typically have static pin outs and interaction protocols. Digital blocks comprised of the digital components have well established and well documented physical layouts and electrical interactions. Simulators for digital blocks are discrete time event driven simulators.

Analog signals generally have continuous input and output values that may vary over time. Analog components typically have customizable layouts in order to modify inputs, outputs, triggers, biases, etc. Therefore, due to customization, analog blocks comprised of the analog components may not have as well established or well documented physical layouts or electrical interactions as digital circuits. Simulators for analog blocks generally necessitate continuous time domain simulators.

Mixed signal blocks are a combination of digital signal blocks and analog signal blocks within a component being simulated. The most common options available for simulation are to simulate the component as a grouping of analog blocks, or to separately analyze the analog components/blocks and the digital components/blocks and translate the inputs and outputs at the boundaries of the digital and analog domains for inter-domain communication.

Within EDA there are two broad categories of circuit review that are related: simulation and verification. Simulation is a numerical solution set that predicts the behavior of a circuit. Verification is the systematic pursuit of describing the behavior of a circuit under relevant conditions (functional verification) and over manufacturing process variation (parametric verification). Therefore, verification generally necessitates a much more extensive review of the circuit, its operating conditions, and manufacturing operation variations than a simulation. It is possible to run a large number of simulations without verifying to any significant degree the functionality of a circuit. Verification is the mathematical modeling of circuit behavior and evaluation of circuit performance over a range of conditions. Ultimately, the measure of success of verification is to report how well the circuit design complies with the circuit specification. Analog and mixed signal verification methodology is struggling to keep pace with the complexity, cost, and computational demands of ever-growing analog and mixed signal circuits.

The number and complexity of verification test cases grows with the complexity of analog and mixed signal designs. Additionally, simulation speed decreases and memory utilization increases as the size of the circuit grows. Thus, the computational processing-power to verify a circuit may dramatically increase with circuit complexity. To make this issue more painful, verification normally occurs at the end of the design cycle where schedule delays are perceived to be most severe. Thus, verification is an activity that generally necessitates a significant amount of simulation processing-power for a small part of the overall design cycle, and therefore an efficient use of verification resources is generally necessitated to meet time to market demands.

Today's complex verification solutions specifically focus engineering on the verification activity to ensure that the operation of the circuit is fully and efficiently verified under pertinent conditions. This focused analog and mixed signal verification is much more manual and experience driven than digital verification. This sporadic interactive analog verification leaves companies at risk. The present disclosure may allow verification tasks to be defined at a higher level of abstraction. The present disclosure may allow efficient capture of complex relationships between stimulus or stimulus assertions and output measurements or output assertions. The present disclosure may allow the test of transistor level circuits, circuits implemented with behavioral models, or circuits that contain a combination of behavioral models and transistor level implementations. Standard branch contribution statements cannot be used in conditional, looping, nomenclature or analysis based statements, unless the conditional expression is a constant expression. For purposes of differentiation, we are calling these standard branch contribution statements as direct branch contribution statements. In this disclosure an indirect branch contribution statement (IBCS) is more powerful than a direct branch contribution statement (DBCS). Specifically, indirect branch contribution statements can be used in conditional and looping constructs that are dynamic with respect to the user's design, design configuration, simulation/analysis configuration, verification state, and verification history. There is a long felt need for independent branch contribution statements to be used in conditional, looping, nomenclature or analysis based statements or to return different arguments resulting from ongoing analysis.

Robust verification of analog and mixed signal circuits generally necessitates a significant investment in test benches, performance analysis routines, and macro-models that may be used to accelerate the simulations. The complexity of this collateral grows with the complexity of the analog and mixed signal integrated circuits to be verified. As a design team adds design resources it also needs to add verification resources, adding to the cost of the design. The efficient use of those resources becomes paramount due to the inevitable time constraints that are imposed at the end of the design cycle, when companies are trying to get a product to market.

The current technology trajectory, within the electronics manufacturing industry, is to move more and more toward single chip designs, called Systems on a Chip (SoC), or multi-chip modules (MCM) where multiple chips are included in one package. Most systems on a chip and multi-chip modules generally necessitate some level of mixed signal verification. As mixed signal designs continue to increase in size and complexity, this places additional burdens on verification to insure first pass design success and reduce the time-to-market. Although the complexity of analog and mixed signal ASIC design has followed Moore's law, innovations in design verification generally have not.

Valuable design time and computational resources as well as expensive simulator resources may be specifically focused by the disclosed method for translating verification subroutine commands. The method makes the capture of complex stimulus as well as capture of output assertions and measurements more efficient. The resulting intelligent test benches identify areas that fail verification and, by greatly reducing the need for manual interpretation of results, provide much more immediate feedback to the design team and design management. Improving the test efficiency (i.e., not wasting simulation time and reducing time for output analysis) allows more efficient use of resources.

This disclosure is related to translating verification subroutine commands during verification of an electronic design for analog and mixed signal (A/MS) application specific integrated circuits (ASICs). Analog and mixed signal integrated circuits exist in many modern electronic devices, and these circuits needs to be verified through simulation prior to fabrication.

SUMMARY

There is provided according to, just one example and it's aspect of the present disclosure of a computer implemented system and method of translation of verification commands of an electronic design, comprises the steps of receiving the electronic design, receiving at least one analog test harness model having at least one indirect branch contribution statement, translating the at least one indirect branch contribution statement into a plurality of direct branch contribution operators based at least in part upon the at least one analog test harness model and generating a netlist based at least in part upon the translation.

BRIEF DESCRIPTION OF THE DRAWINGS

The present disclosure will be more clearly understood from consideration of the following detailed description and drawings in which.

Figure 1:
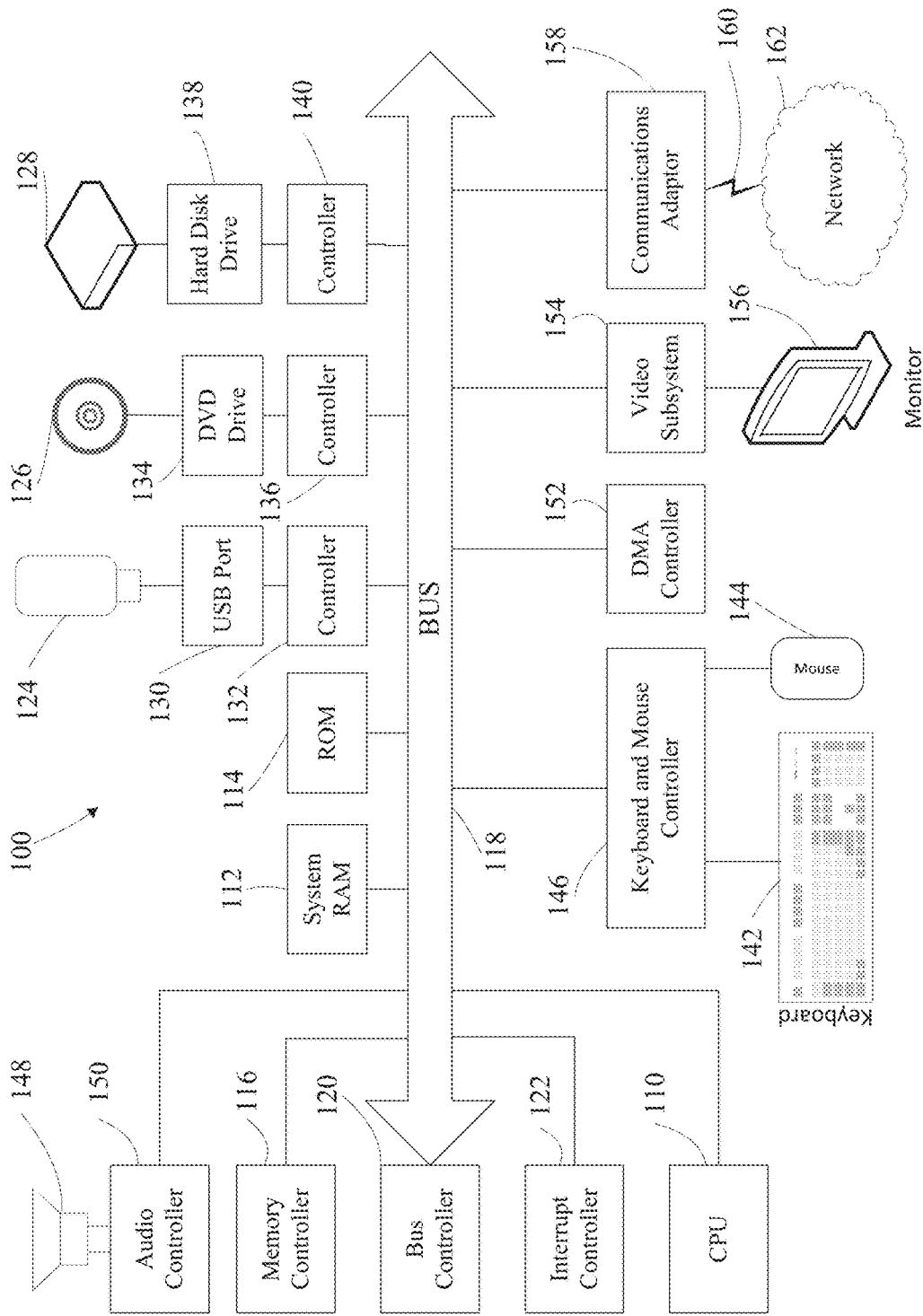
FIG. 1 is a block diagram showing a computer system suitable for practicing the instant disclosure.

References in the detailed description correspond to like references in the various drawings unless otherwise noted. Descriptive and directional terms used in the written description such as right, left, back, top, bottom, upper, side, et cetera, refer to the drawings themselves as laid out on the paper and not to physical limitations of the disclosure unless specifically noted. The drawings are not to scale, and some features of examples shown and discussed are simplified or amplified for illustrating principles and features as well as advantages of the disclosure.

DETAILED DESCRIPTION

The features and other details of the disclosure will now be more particularly described with reference to the accompanying drawings, in which various illustrative examples of the disclosed subject matter are shown and/or described. It will be understood that particular examples described herein are shown by way of illustration and not as limitations of the disclosure. Furthermore, the disclosed subject matter should not be construed as limited to any of examples set forth herein. These examples are provided so that this disclosure will be thorough and complete, and will fully convey the scope of the disclosed subject matter to those skilled in the art. The principle features of this disclosure may be employed in various examples without departing from the scope of the disclosure.

The terminology used herein is for the purpose of describing particular examples only and is not intended to be limiting of the disclosed subject matter. Like number refer to like elements throughout. As used herein the term "and/or" includes any and all combinations of one or more of the associated listed items. Also, as used herein, the singular forms "a", "an", and "the" are intended to include the plural forms as well, unless the context clearly indicates otherwise. It will be further understood that the terms "comprises", and/or "comprising" when used in this specification, specify the presence of stated features, integers, steps, operations, elements, and/or components, but do not preclude the presence or addition of one or more other features, integers, steps, operations, elements, components, and/or groups thereof. Also, as used herein, relational terms such as first and second, top and bottom, left and right, and the like may be used solely to distinguish one entity or action from another entity or action without necessarily requiring or implying any actual such relationship or order between such entities or actions.

Cost of entry barriers into analog and mixed signal IC design is endemic especially to fabless companies that are developing ASIC intellectual property in the form of packaged ASICs or modules to be integrated into their customer's Systems-on-Chip (SoCs) or multi-chip modules (MCMs). For example, if a fabless design center is staffed with five IC design engineers, equipping the team with design tools is financially equivalent to quadrupling the staff. This is due to the high cost of ownership of the EDA tools, not just in annual license fees, installation and support, training and the like. Reducing system use through translation of verification commands allows more efficient resource allocation.

Analog and mixed signal verification is time and computer intensive. Functionality of the circuit for various inputs, at various conditions and for various manufacturing conditions are generally necessitated to be simulated to insure that the circuit functions to the specifications.

Branch contribution statements are utilized to describe behavior in continuous time between analog nets and ports. The direct contribution statement utilizes a branch contribution operator, <+, to describe a mathematical relationship between one or more analog nets. These direct contribution statements utilize arguments that are a constant expression. Standard branch contribution statements cannot be used in conditional, looping, nomenclature or analysis based statements, unless the conditional expression is a constant expression. For purposes of differentiation, we are calling these standard branch contribution statements as direct branch contribution statements. In this disclosure an indirect branch contribution statement (IBCS) is more powerful than a direct branch contribution statement (DBCS). Specifically, indirect branch contribution statements can be used in conditional and looping constructs that are dynamic with respect to the user's design, design configuration, simulation/analysis configuration, verification state, and verification history. Indirect branch contribution statements allow dynamic code that generates direct branch contribution statements based on the content of the netlist.

AMST™ (Analog Mixed Signal Test) is a module for specifying analog/mixed-signal (A/MS) stimulus as well as assertions and output measurements. An AMST is able to efficiently capture complex relationships between stimulus and output assertions. Verification models specified in the AMST Language (AMSTL™) captures higher level commands that are subsequently translated into Verilog-A/AMS. Verilog-A, Verilog-AMS, VHDL-AMS, SystemC-AMS or the like, which are standardized languages for defining analog and mixed-signal, respectively. It is envisioned that the code could also be used to generate any language standard that supports direct branch contribution statements for analog simulators.

AMSTL can be used to capture higher level commands with IBCS regardless of whether the resulting translated code will be used in the behavioral model of a circuit or a test harness. The value of capturing assertions within an AMST rather than in the behavioral model of the circuit is that the verification commands can be reused regardless of the representation of the circuit. For example, in FIG. 15 the AMP_AMST block will execute the same commands and assertions whether the op amp and mux are represented as transistor level schematics or behavioral models. The AMP_AMST now serves as verification intellectual property (VIP) that can be reused with these circuits. This concept becomes especially valuable when considering the case of providing analog design intellectual property (IP) to a third party. The purchasing party now has verification IP that can be embedded with the purchased IP within a larger SOC. This VIP reduces the risk that the purchased design IP will be used incorrectly. Verification IP has been a proven concept for digital circuits and top-level inputs and outputs but has not been previously practical to provide with embedded analog IP.

The language AMSTL is intended to describe behaviors, stimulus, outputs, measurements, etc. for analog mixed signal integrated circuit design and provides higher level constructs than available in standard hardware description languages that are intended for input into analog simulators. One benefit is an efficiency improvement based on the availability of IBCS in AMSTL. Additionally, AMSTL code can be parsed to output any desired standard language. The module AMST is a behavioral model of analog mixed-signal verification intellectual property and is intended to reside at any level of the hierarchy within the design. The module may reside with the IP that it is monitoring, stimulating and/or evaluating. The output form of the model (in Verilog-A, Verilog-AMS, VHDL-AMS, etc.) can be input through a netlist into an analog or mixed-signal simulator.

A netlist is a representation of one or more databases that contain information relevant to a verification project and simulation task including but not limited to:
1) a description of components (e.g. transistors, resistors, capacitors, behavioral model, AMSTs, digital gates) and properties of components that make up the design (e.g. PMOS2 has W=1 um),
2) the connectivity of the design (e.g. drain of PMOS1 is connection to gate of NMOS2),
3) hierarchical configuration of the design for a specific simulation task (e.g. PLL1 is represented as a model, LDO3 is represented at the transistor level)
4) configuration of the simulation task including simulation type (e.g. transient simulation), duration (e.g. 2 ms), tolerance settings (e.g. iabstol<10e-10), configuration of interface elements between digital and analog partitions, and output signal selections
5) any information in the verification database such as expected performance values, signal transitions, signal shape, duty cycle, etc of any signal or element of interest to the verification activity).

The netlist is the input to a simulation. The purpose of a simulation is to predict the behavior of the circuit described in the netlist subject to the stimulus conditions and accuracy criteria specified in the netlist. Simulation is an essential part of integrated circuit (IC) design since a) photomasks for IC designs are very expensive b) IC manufacturing takes a long time, c) probing of signals internal to an IC is extremely difficult and d) bread-boarding of modern IC designs is impractical. A simulation is performed with a simulator. At a high level, there are three approaches to simulating an integrated circuit: SPICE-level simulation, digital-level simulation, and mixed-mode simulation. A SPICE-level simulator reduces the netlist to a set of nonlinear differential algebraic equations which are solved using implicit integration methods, Newton's method, and sparse matrix techniques. A SPICE-level simulator conserves charge, satisfies Kirchhoff's Current Law and Kirchhoff's Voltage Law, subject to a set of absolute or relative tolerances. A digital simulator reduces the netlist to a set of boolean functions which are triggered by discrete events. Digital simulators do not conserve charge, satisfy Kirchhoff s Current Law or Kirchhoff's Voltage Law. But they can simulate much larger circuits at a higher level of abstraction. Mixed-mode (AMS) simulation combines a SPICE-level simulator with a digital simulator. In this type of simulation a SPICE-level simulator is used to simulate a portion of the design, predicting the net voltages and terminal currents of the components in the SPICE-level partition, while the digital simulator is used to predict the digital outputs of the components in the digital partition. In a mixed-mode simulation, the SPICE-level partition and the digital partition are connected with interface elements which, at a basic level, are idealized 1-bit analog to digital converters (for signals going from the SPICE partition to the digital partition) and 1-bit digital to analog converters (for signals going from the digital partition to the SPICE partition).

A simulation can produce the following outputs:
1) continuous-time/continuous-value waveforms of net voltages and terminal currents;
2) discrete-time/discrete-value digital waveforms of logic net outputs;
3) any data written by any behavioral model including any AMST modules that have been included into the netlist;
4) assertion violation messages; and
5) debug information about model behavior, circuit convergence difficulties, etc.

The outputs from the simulation are stored in one or more databases. These outputs are subsequently used to evaluate the suitability of the circuit. This process can be manual. A designer can, for example, review waveforms in a graphical waveform viewer. The process can also be automated. A software program can programmatically analyze waveform results and AMST outputs to build a spec compliance matrix which summarizes the set of design objectives that have been satisfied and the set of design objectives that have been failed in the circuit simulation.

Examples of what may be done with indirect branch contribution statements (IBCS):
1. Write an indirect branch contribution statement that supports a bus with an arbitrary number of pins (e.g. reference current bus). As the size of the bus is changed by the designers, the number of actual direct branch contribution statements is dynamically reconfigured.
2. Write an indirect branch contribution statement that extracts spec limits from the net names, or circuit connectivity, allowing the implementation of supply connectivity checks.
3. Write an indirect branch contribution statement that sets limits based upon previous simulation results.
4. Write an indirect branch contribution statement that adds additional checks but only for the transistor-level implementation of a block.

In each of these cases the code that makes up the indirect branch contribution statement generates Verilog-A/AMS statements that are compatible with the language standard.

Therefore the disclosed system and method of translation of verification commands may solve one or more of the following issues, to allow more efficient use of computer and personnel resources through reduced programming time, to reduce the time lag to market and/or to insure a more focused and thorough verification confirmation.

Computer System of FIG. 1 illustrates the system architecture, for an exemplary computer system 100, on which the current disclosure may be implemented. The exemplary computer system of FIG. 1 is for descriptive purposes only. Although the description may refer to terms commonly used in describing particular computer systems, such as a personal computer, the description and concepts equally apply to other systems, including systems having architectures dissimilar to FIG. 1.

Computer system 100 typically includes a central processing unit (CPU) 110, which may be implemented with one or more microprocessors, a random access memory (RAM) 112 for temporary storage of information, and a read only memory (ROM) 114 for permanent storage of information. A memory controller 116 is provided for controlling RAM. A bus 118 interconnects the components of the computer system. A bus controller 120 is provided for controlling the bus. An interrupt controller 122 is used for receiving and processing various interrupt signals from the system components. Mass storage may be provided by flash 124, DVD 126, or hard disk 128, for example a solid-state drive. Data and software may be exchanged with the computer system via removable media such as the flash drive and DVD. The flash drive is insertable into a Universal Serial Bus, USB, drive 130, which is, in turn, connected to the bus by a controller 132. Similarly, the DVD is insertable into DVD drive 134, which is, in turn, connected to bus by controller 136. Hard disk is part of a fixed disk drive 138, which is connected to the bus by controller 140.

User input to the computer system may be provided by a number of devices. For example, a keyboard 142 and a mouse 144 are connected to the bus by a controller 146. An audio transducer 148, which may act as a microphone and a speaker, is connected to bus by audio controller 150, as illustrated. Other input devices, such as a pen and/or tablet, may be connected to the bus and an appropriate controller and software. DMA controller 152 is provided for performing direct memory access to the system RAM.

A visual display is generated by video subsystem 154, which controls video display 156. The computer system also includes a communications adaptor 158, which allows the system to be interconnected to a local area network (LAN) or a wide area network (WAN) or other suitable network, schematically illustrated by a bus 160 and a network 162.

Operation of the computer system is generally controlled and coordinated by an operating system, such as the Windows and Windows 7 operating systems, available from Microsoft Corporation, Unix, Linux or Apple OS X operating system, to name a few. The operating system controls allocation of system resources and performs tasks such as processing scheduling, memory management, networking, and I/O services, among other things.

Figure 2:
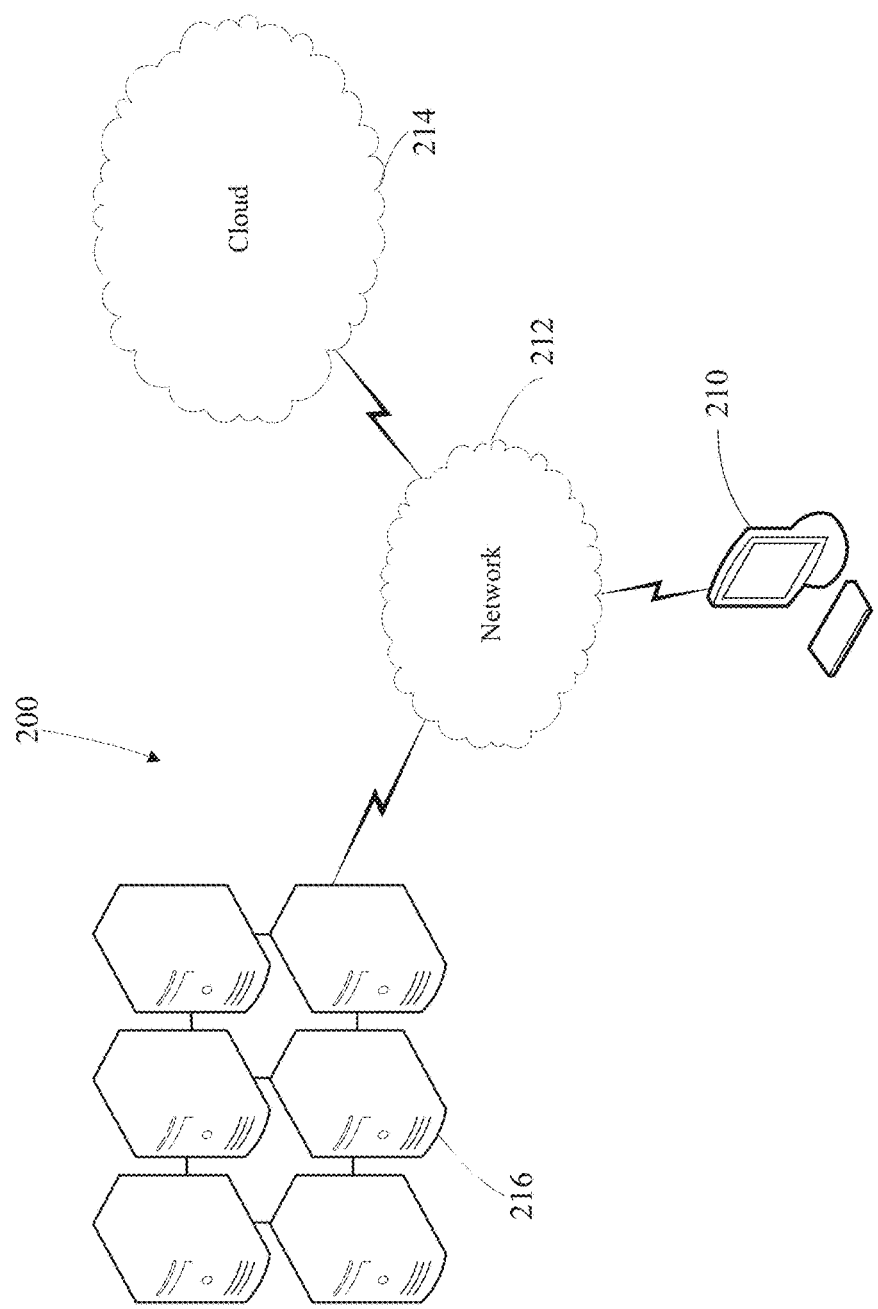
FIG. 2 is a block diagram showing a computer network system suitable for practicing the instant disclosure.

Computer System FIG. 2 illustrates the system 200 in which the computer user 210 is connected to a network 212 which in turn is connected to the cloud 214 and the compute farm 216.

Figure 3:
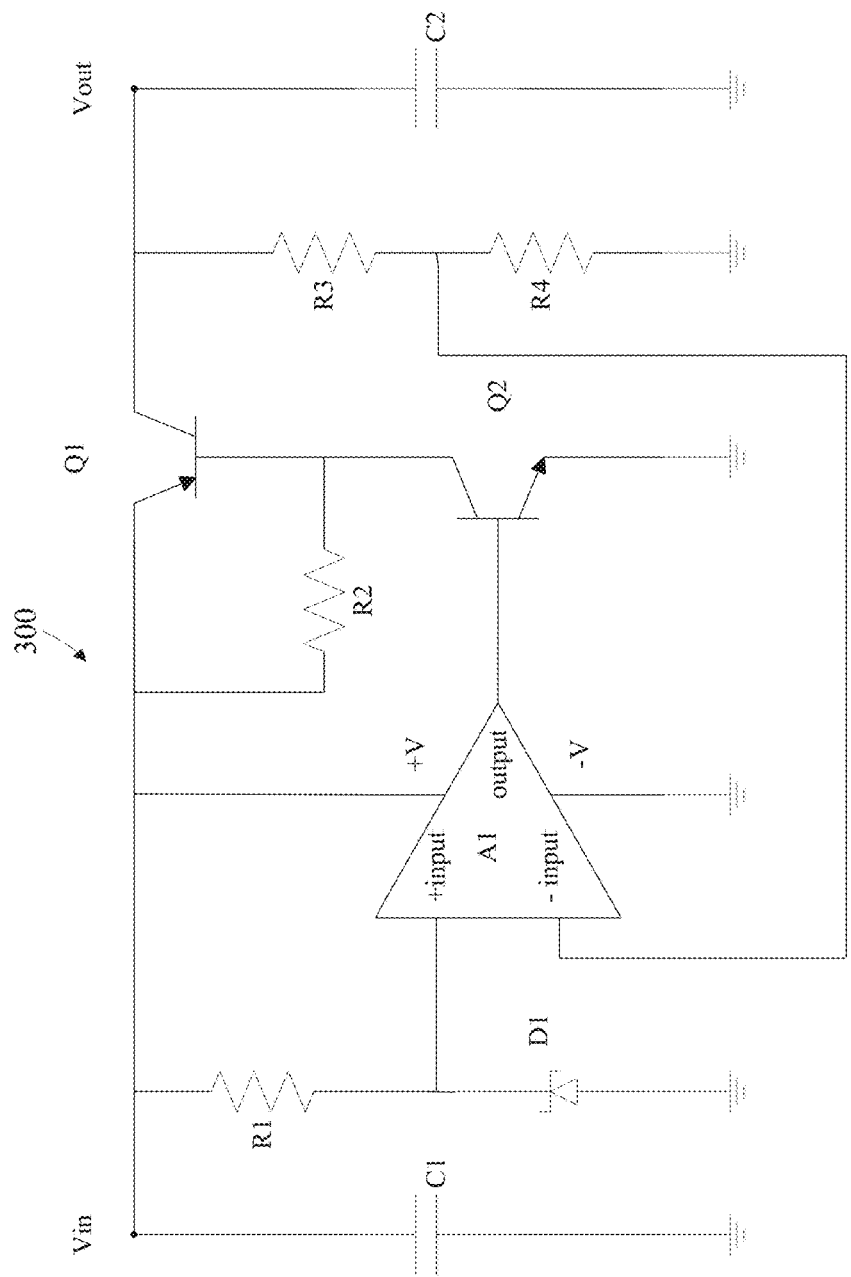
FIG. 3 depicts an example Low Voltage Dropout (LDO) circuit.

An example schematic of a low voltage dropout (LDO) 300 circuit is shown in FIG. 3. The LDO has an amplifier A1, having an inverting input (−input), a non-inverting input (+input) an output, a positive voltage input +V and a negative voltage input −V. The LDO circuit has a voltage in Vin and a voltage out Vout. The LDO has a power out block Q1, Q2 and R2. The LDO feedback circuit is comprised of R3, R4, D1 and R1. The amplifier A1 is termed a symbol, the elements D1, R1, R2, R3, R4, C1, C2, Q1 and Q2 are referred to as primitives.

Figure 4:
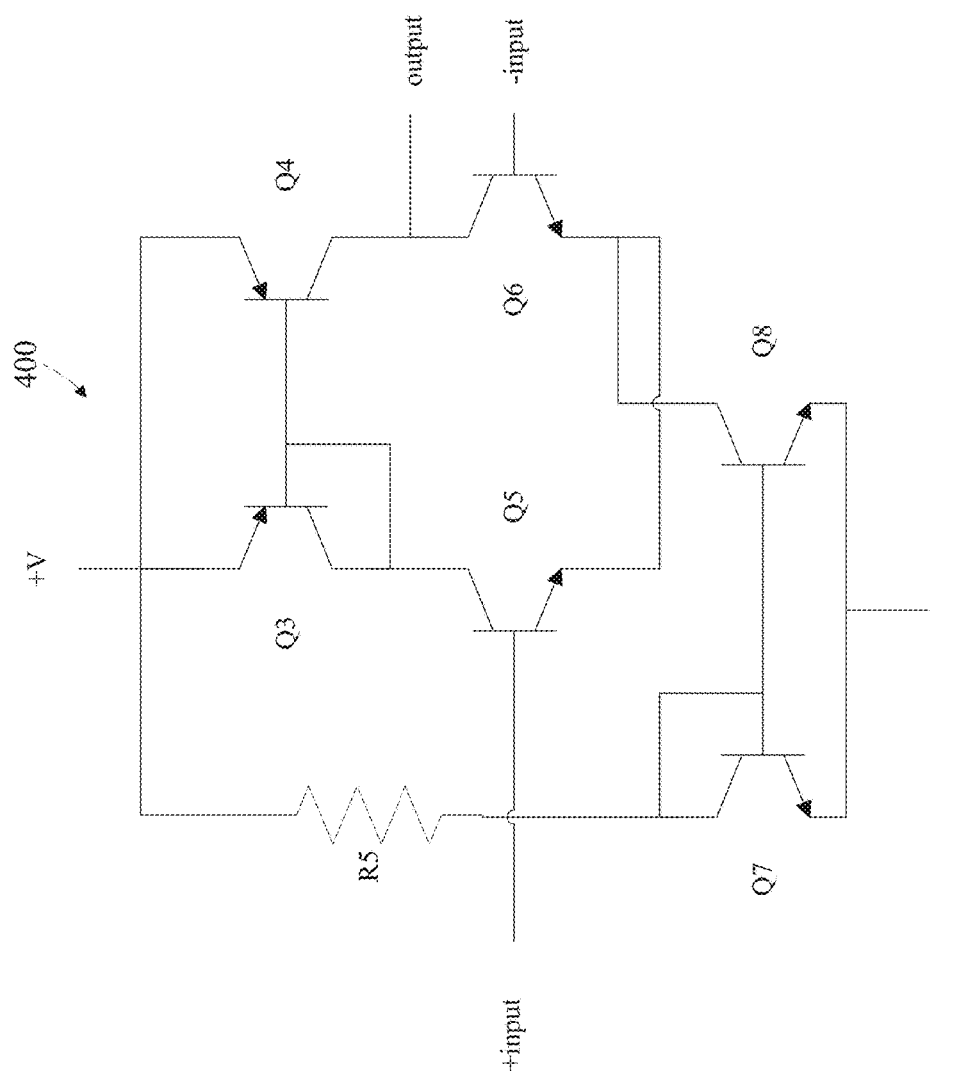
FIG. 4 depicts an example amplifier circuit.

An example schematic of an amplifier A1 400 circuit is shown in FIG. 4. The symbol of the amplifier is comprised of transistors Q3, Q4, Q5, Q6, Q7 and Q8 and resistor R5. The amplifier A1, having an inverting input (−input), a non-inverting input (+input) an output, a positive voltage input +V and a negative voltage input −V.

Figure 5:
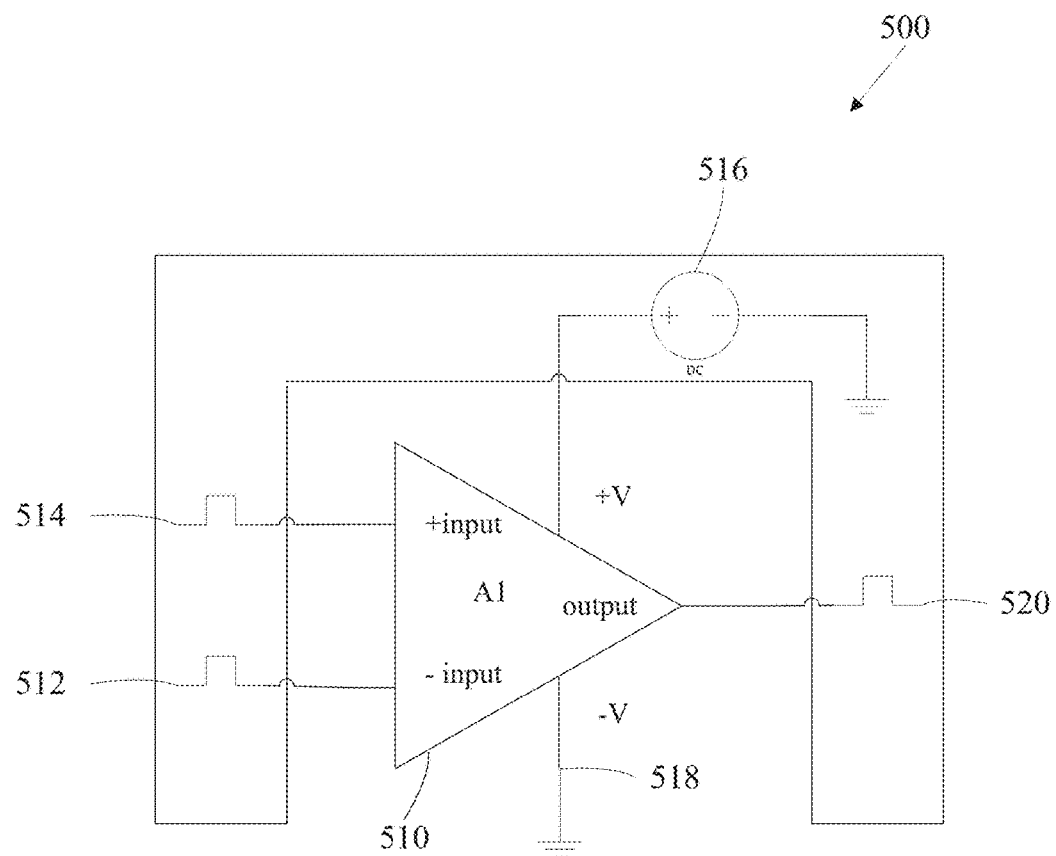
FIG. 5 depicts a test bench pin out for an amplifier.

FIG. 5 shows a test bench 500 for amplifier A1 510. A test bench is a specific configuration of inputs, outputs, test conditions and the like that are run for a device to which it is connected. The test bench has an inverting input 512, a non-inverting input 514, a positive power input 516, a negative power input 518 and an output 520. The test bench has associated connections, power supplies, IOs, etc. which are referred to as the test bench collateral. The portion around the periphery of the circuit is referred to as the verification harness. Pin outs and the operation of the verification harness need to be matched to the circuit under test.

Figure 6:
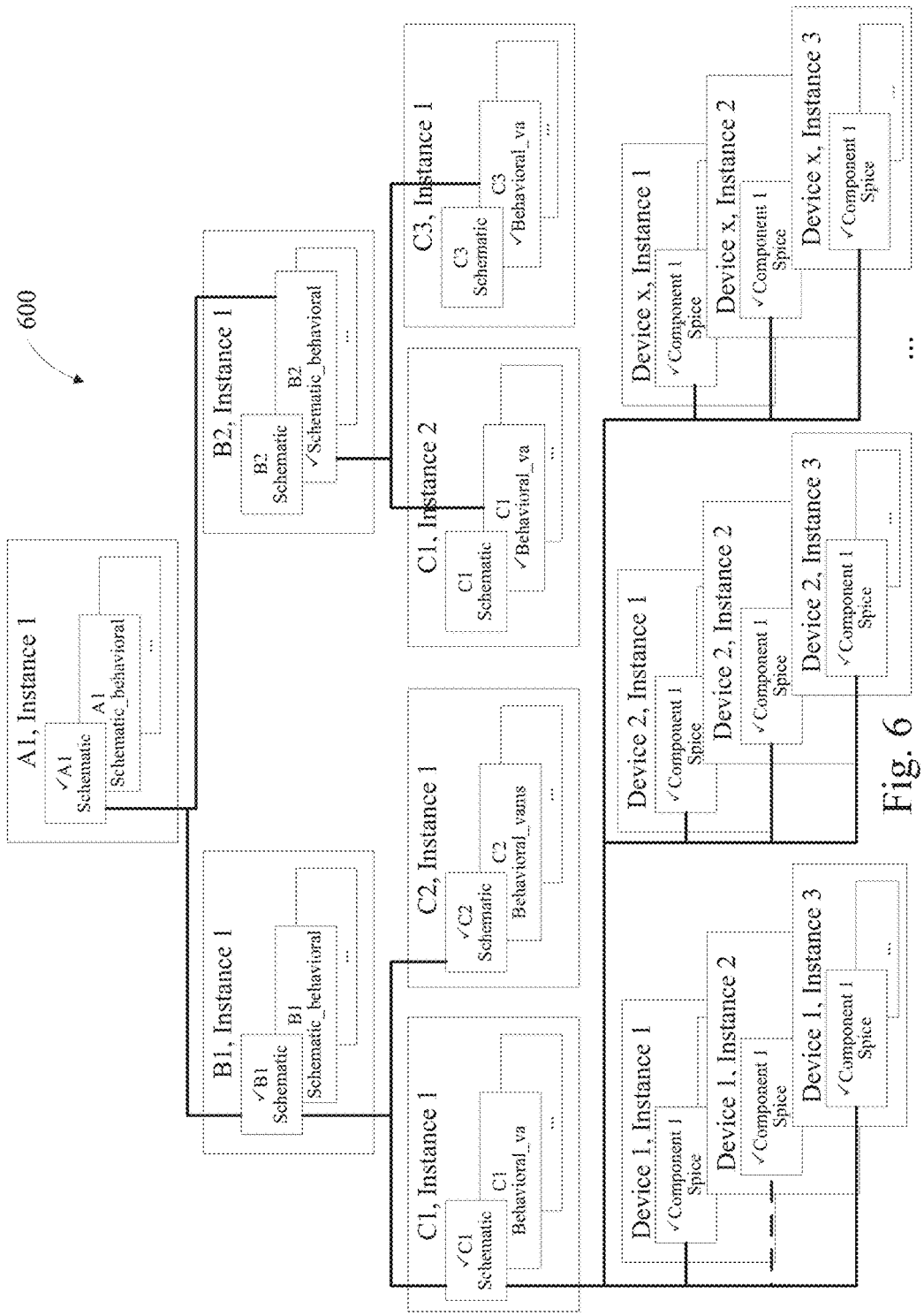
FIG. 6 depicts a general example hierarchy.

FIG. 6 shows a general example hierarchy 600 of a Test bench with a device under test, DUT. The hierarchy is arranged according to levels, A, B, C and Device and according to instances 1, 2 and 3. The connecting lines indicate which models are connected throughout the hierarchy for a specific verification. Within level and instance, multiple view types may exist. The examples illustrate some possible hierarchical configurations and are not intended to limit the cases and views or view types.

Integrated circuit design hierarchy is the representation of integrated circuit designs utilizing hierarchical representations. This representation allows for more efficient creation of complex designs that may include millions of components such as transistors, resistors, and capacitors as well as the metal lines that connect the devices. The design hierarchy representation used at any given point in the design process may vary based on the design step being performed and the type of design function such as analog, digital, or memory.

In the case that a design is to be manufactured, a layout of the design is created so that a representation may be mapped. This mapping allows patterns to be created on individual levels of the mask sets to allow design manufacture. In general, the design flow to create the layout representation is very different for analog as compared to digital functional blocks and subsystems.

Early in the design process, there may be large portions of the design that are designed for the first time and do not have any existing layout representations. Other portions of the design may already have been proven, and these may be represented at a higher level of abstraction or in combination may include the layout representation.

Some common types of design representations referred to here as views may comprise various view types. A Schematic view type is a picture of components or blocks with connectivity shown by lines or nets and connections to other levels of the hierarchy through pins. A Spice view type is a representation of a component and its associated parameters, possibly including a specific device model that will be instantiated into the spice netlist. An LVSExtract is a view type that is created by a tool analyzing the layout view and reverse engineering the individual components and connectivity. Variations of this type of view may also include extracted parasitic components resulting from the physical layout that were not drawn by the designer. A Layout view type is a representation of the specific geometries including routing for that portion of the design. A Verilog™ view type is a text file that is in standardized Verilog™ format. A Verilog-A™ view type is a text file in standardized Verilog-A™ syntax. A Verilog-AMS™ view type is a text file in standardized Verilog-AMS™ syntax. View type names may be different depending on the electronic design automation tool provider, examples of which include SpectreHDL and HDL-A.

Other types of view types may help organization and readability of the hierarchy. As an example, graphic design tools such as schematic capture systems may use a Symbol view type for the graphic that is placed. The symbol may contain pins that connect the instance through the hierarchy as well as a drawing that indicates the function of the block. Examples include common symbols for operational amplifiers, basic digital gates, transistors, resistors, and the like.

Further adding to the complexity of description, a given block at a level of the design hierarchy may include multiple views of the same view type. An example would be different Verilog™ representations of a given block, for instance, one with annotated timing based on the layout, one with estimated timing, one without timing, or different levels of design representation such as gate-level or register transfer level (RTL). Similarly, an analog view may have numerous schematic views: for instance, one that will map to the final transistor-level design, one that includes placement of behavioral blocks for higher level modeling, one that may include parasitic elements from the layout, one that includes interface elements between analog and digital blocks for mixed-signal simulation. Also, for analog blocks there may be multiple Verilog-A™ or Verilog-AMS™ model views for the same block where models include different functionality and accuracy based on the purpose of different simulation exercises. These multiple views and view types are mapped into configurations that are used for a specific task or analysis.

Often view names are created to provide hints for what types of analysis a specific view may be useful. View name may include those listed hereinafter and the like. A Schematic is a schematic view including the placement of blocks that may be evaluated at the transistor level or at some level of the hierarchy such as a behavioral model. A Schematic_behavioral is a schematic view that comprises behavioral elements. A Schematic_parasitics is a schematic view that includes parasitic components extracted or estimated from the layout. A Spice is a spice view that includes the information implemented in a netlist and a component for a specific analog simulator. A Behavioral_va is a text view in the Verilog-A™ format that models a specific block for an analog simulator that may evaluate Verilog-A™, and a Behavioral_vams is a text view in the Verilog-AMS™ format that models a specific block for a mixed-signal simulator that may evaluate Verilog-A™ and Verilog.

In the specific example shown in FIG. 6, general example hierarchy, with device under test A1, Instance 1, would be defined based on the following configuration: A1, Instance 1 and B1, Instance 1 are modeled with a Schematic level model. B2, Instance 1 is modeled with a Schematic_behavioral model, and C1, Instance 1 and C2 Instance 1 are modeled using a Schematic model. C1, Instance 2 and C3, Instance 1 are modeled with a Behavioral_va model. At the bottom of the hierarchy, Devices 1, 2 and 3, instances 1, 2 and 3 are modeled using Spice.

In the specific example shown in FIG. 6, Device 1, Instance 2 is a dummy device and therefore would not change the simulator matrix. Device 1, Instance 2 is placed in the C1, Instance 1 schematic connected as a dummy device and is therefore not part of the A1, Instance 1 matrix that would be stamped in the simulator.

Whether a change necessitates a verification to be rerun is determined in part by the connections through the hierarchy. In this specific example for general example hierarchy, device under test A1, Instance 1, if Device 1, Instance 2, Schematic view is changed the simulator would not need to be rerun, since the device is a dummy device and would not modify the matrix that would be stamped into the simulator.

With a view to FIG. 6, C1, Instance 1 Schematic view forms part of the configuration of the simulator model, and if it is changed and the change is substantive enough to affect the simulator matrix, Test bench 1 would need to be rerun. C1, Instance 2 Schematic view would not form a part of the configuration of the simulator model example, therefore if it is changed, Test bench 1 would not need to be rerun.

At a more abstract level, if C1, Schematic view is changed, therefore changing the schematic view in Instance 1 and 2, which affects a change in the information stamped in the simulator matrix, Test bench 1 would need to be rerun. If a non-substantive change to C1, Schematic view is made for example by adding a comment and no change is made to the information stamped by the simulator in the matrix, this design configuration would not need to be rerun. It is apparent that determining whether a change was made to a configuration and the effect of the stamping of the matrix, may have a large effect on the number of necessitated verification runs.

Figure 7:
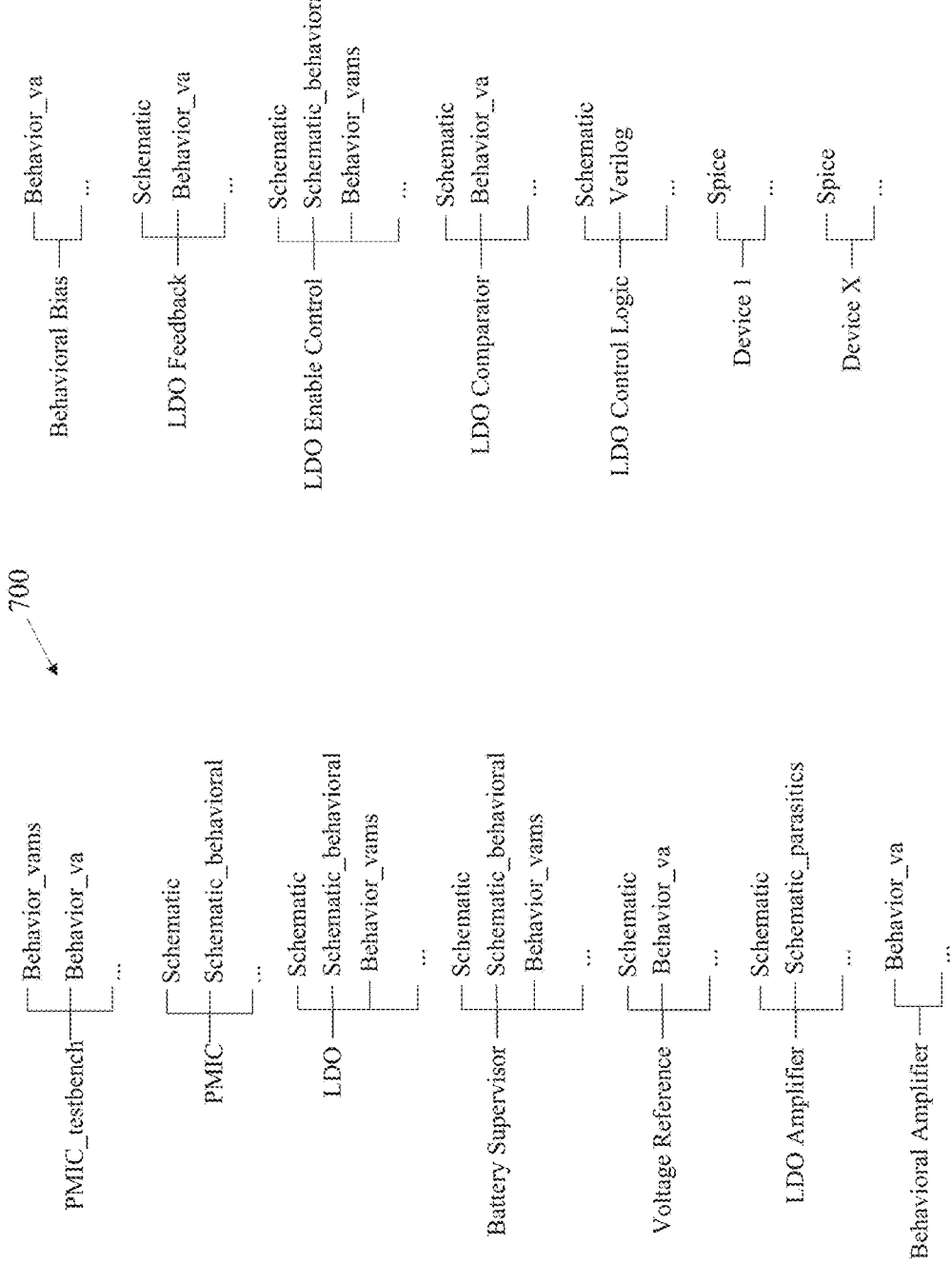
FIG. 7 depicts an instance parsed example test hierarchy.

FIG. 7 shows some of the different model views that may be chosen from for modeling a power management chip PMIC 700. The PMIC_testbench has Behavioral_vams and Behavioral_va levels having stimulus and outputs. The PMIC has Schematic and Schematic_behavioral levels. The LDO, LDO Enable Control and Battery Supervisor are defined at the Schematic, Schematic_behavioral and Behavioral_vams levels. The Voltage Reference, LDO Feedback and LDO Comparator are defined at the Schematic and Behavioral_va levels. The LDO Amplifier is defined at the Schematic and Schematic_parasitics levels. The Behavioral Amplifier and Behavioral Bias are defined at the Behavior_va level. The LDO Control Logic is defined at the Schematic and Verilog™ levels, and Devices 1 through X are defined at the Spice level.

Figure 8:
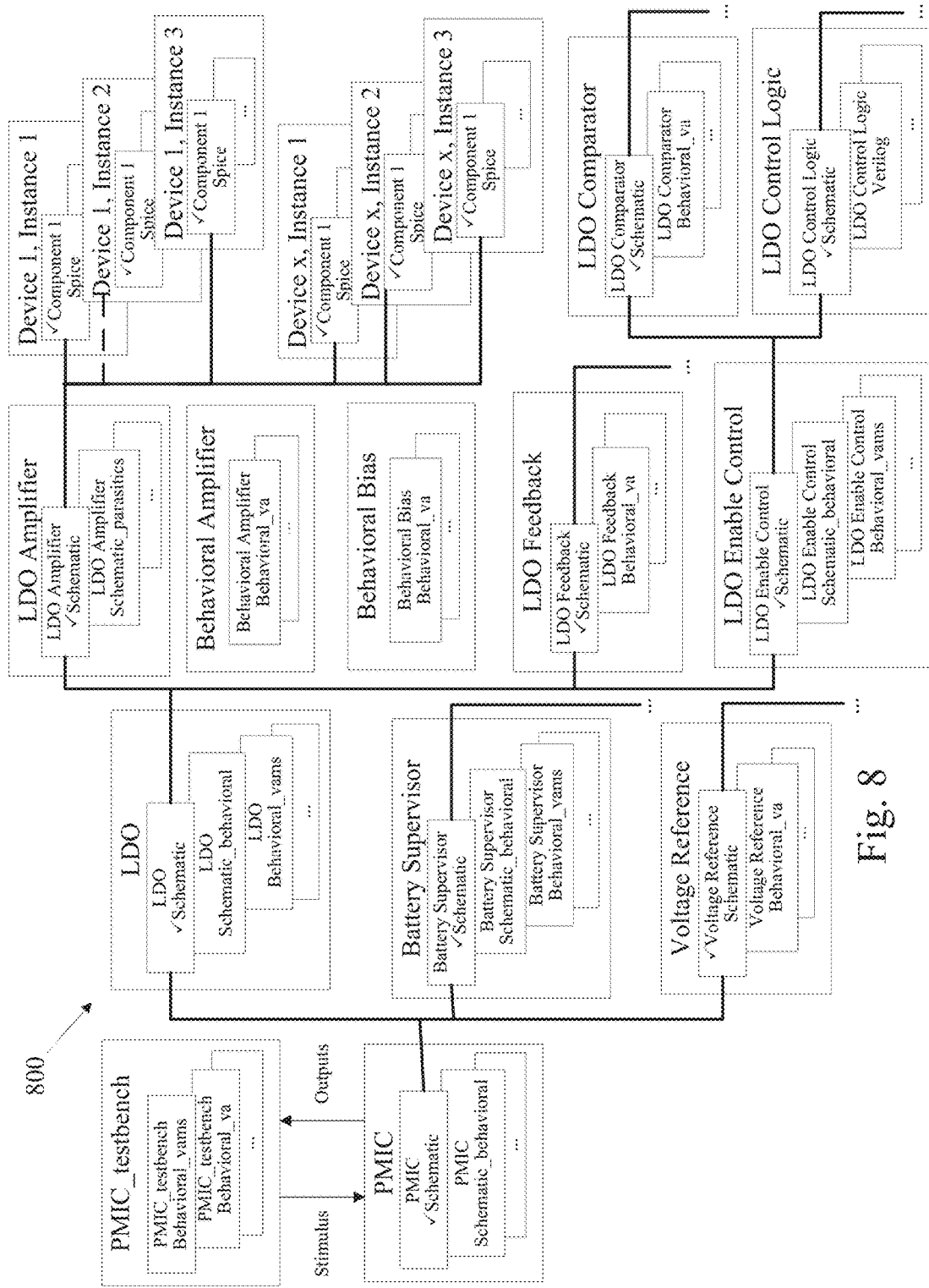
FIG. 8 depicts a first example test bench for a power management integrated circuit.

FIG. 8 shows a first test hierarchy of the power management chip PMIC described in FIG. 6 for a power management chip 800. The figure illustrates a portion of the hierarchy if a Spice primitive component configuration is defined. Device 1, Instance 2 is a dummy device in this model and would not change the simulator matrix.

Figure 9:
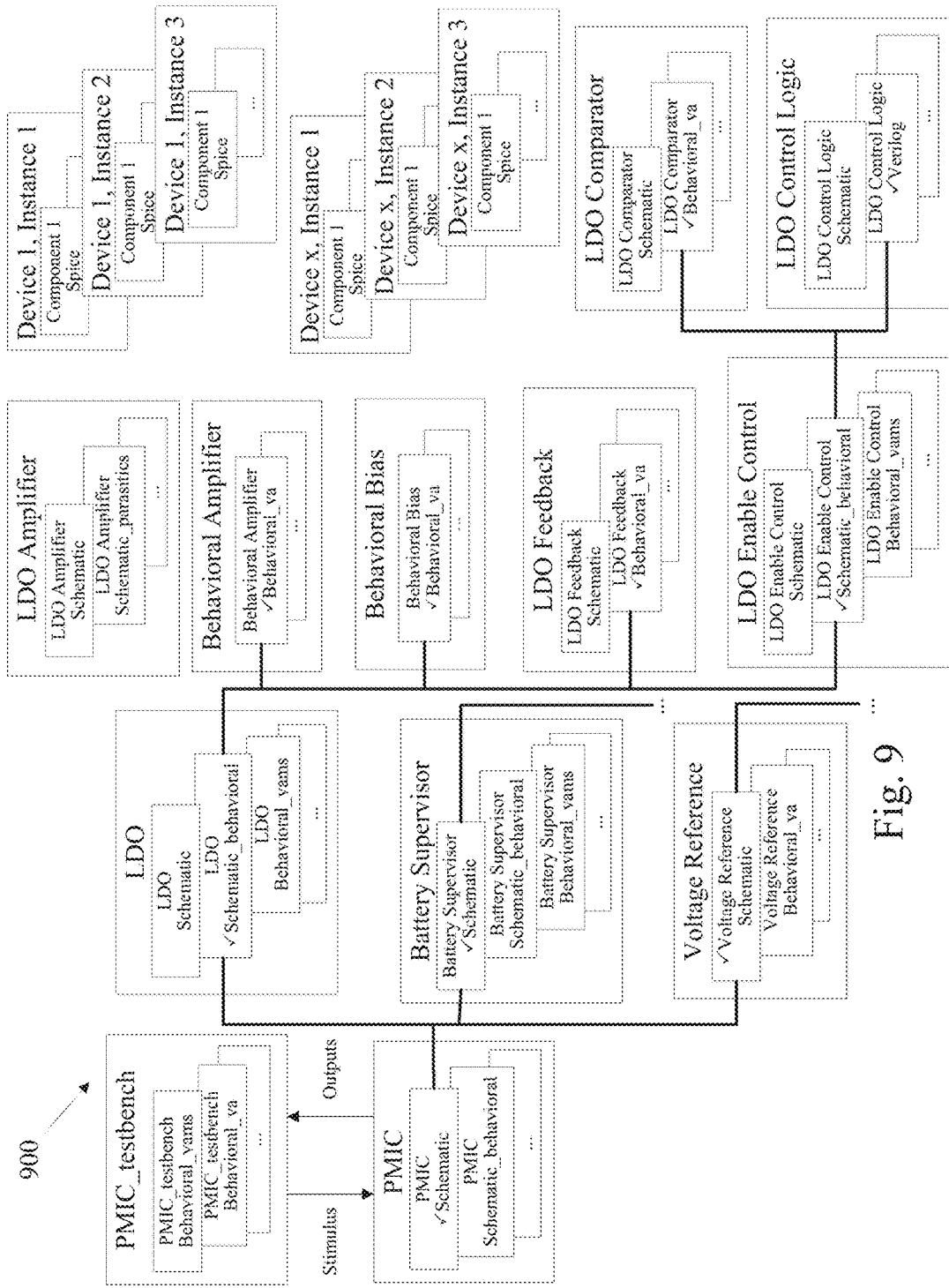
FIG. 9 depicts a second example test bench for a power management integrated circuit.

FIG. 9 shows a second test hierarchy of the power management chip PMIC described in FIG. 7 for a power management chip 900. The figure illustrates a portion of the hierarchy for one possible mixed configuration with some analog behavioral level models, some Verilog™ representations and some Spice primitive components.

Figure 10:
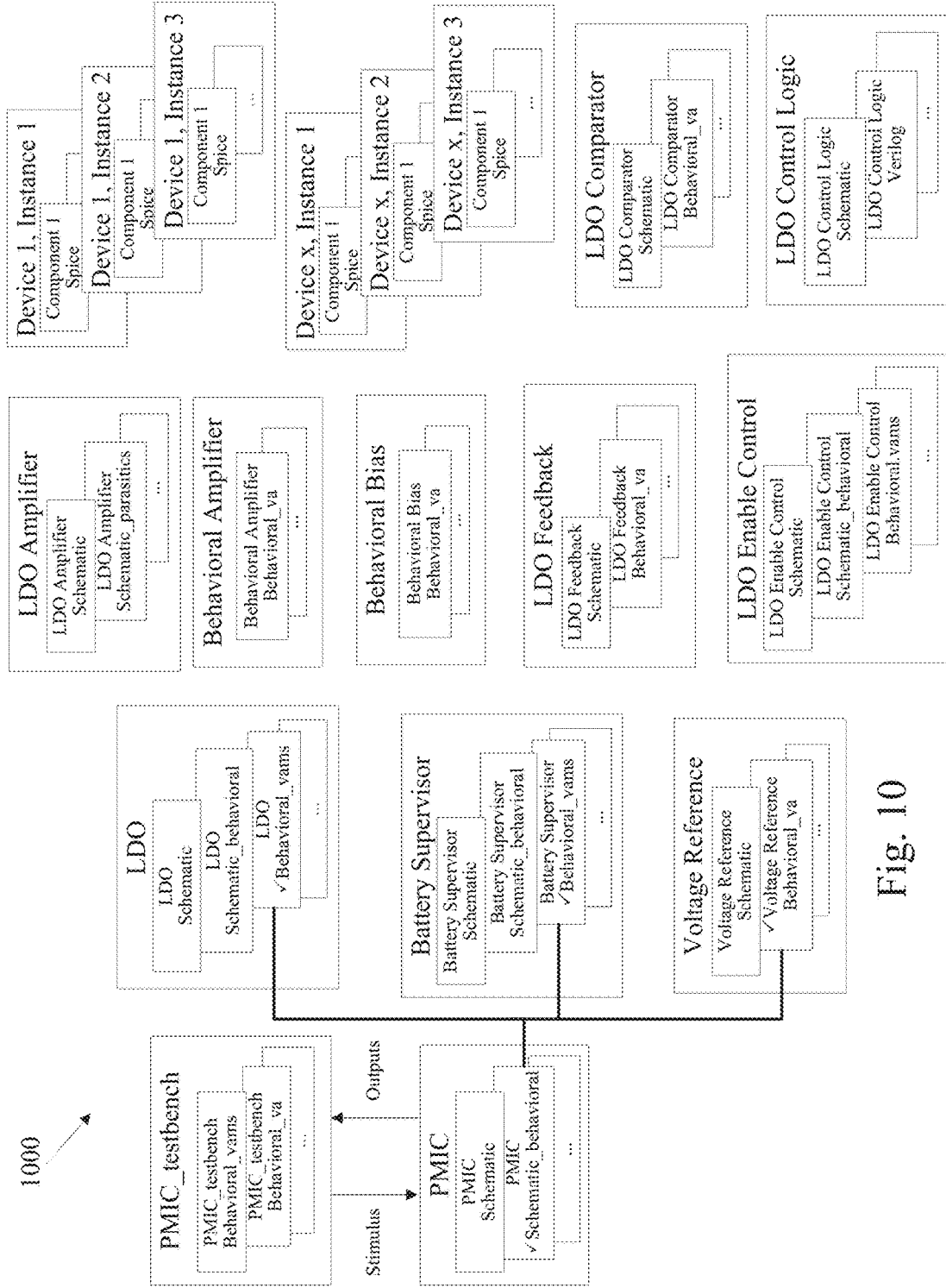
FIG. 10 depicts a third example test bench for a power management integrated circuit.

FIG. 10 shows a third test hierarchy of the power management chip PMIC described in FIG. 7 for a power management chip 1000. The figure illustrates a portion of the hierarchy if a behavioral configuration is defined.

Figure 11:
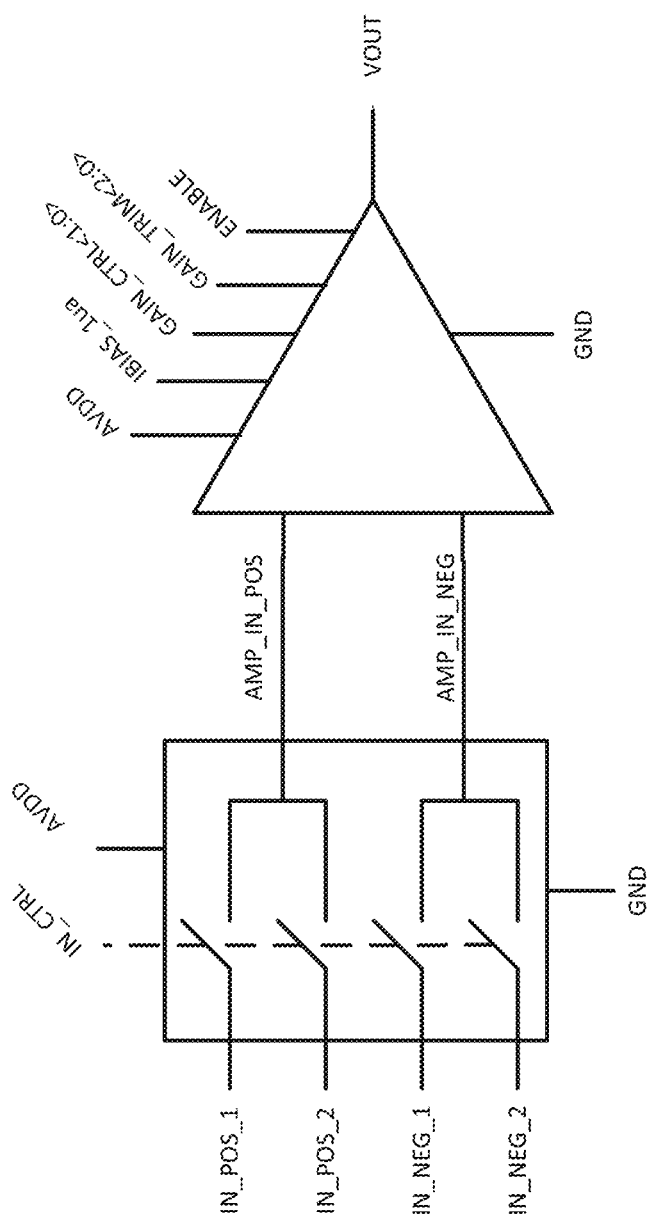
FIG. 11 depicts an example mux and opamp having translating verification subroutine commands of an electronic design.

FIG. 11 depicts a simple example of an operational amplifier with some typical features of an amplifier included within a larger system-on-a-chip (SOC). Even this simple example can demonstrate the increasing complexity of today's verification challenges for mixed-signal designs. Feeding the inputs to the amplifier is a simple multiplexer (mux). The control signal IN CTRL to the mux will serve as a digital input signal to a series of logic gates within the mux block. These gates will then control the switches to select between two pairs of analog inputs: pair one (IN_POS_1 and IN_NEG_1) and pair 2 (IN_POS_2 and IN_NEG_2). For instance, a value of IN CTRL equal to logic level "0" could close the switches connected to IN_POS_1 and IN_NEG_1 while an IN CTRL value of logic level "1" could close the switches connected to IN_POS_2 and IN_NEG_2. The analog inputs selected are then output from the mux. These signals are now connected to the amplifier inputs. The mux block also has connections for the power supplies. In this case because analog signals will pass through the block, the power supply connections are to the analog supply voltages AVDD and GND.

For the amplifier block, the power supply connection is also to the analog supply voltage AVDD and GND. Note that it is not unusual on complex SOC's to have multiple internal power supplies. Even for the analog blocks there may be options such as different power supply levels. In other cases, the same voltage level may be supplied, but one supply source may be used for critical blocks that may be susceptible to any noise on the supply line. Other blocks that are noisier (typically due to functions such as high frequency switching), may be connected to a different supply source that is the same voltage level. For this reason, digital blocks are almost always powered separately from analog blocks. In addition, with the increasing importance of reducing power, some power supplies may be turned off during various operating modes. As a result, design engineers may also need to verify that a given block is connected to a supply that will be available at the appropriate times.

Another common configuration within a larger chip is to have a common block that provides many of the biasing currents required by analog functions. In this example, the amplifier has an input for a 1 uA bias current. Other common options include signals for trim and control or programmability. In this example, the amplifier has 2 control bits, GAIN CTRL<1:0>, that can set a gain value and 3 bits, GAIN_TRIM<2:0>, that would slightly tune the gain value. Trim is typically performed when each device is tested and is used to compensate for manufacturing process variations and match the desired gain values to specified values as closely as possible. In this case GAIN CTRL is a programmability feature to pick the best gain setting for a specific application. The ENABLE signal allows the amplifier to be powered on or off while the chip is operating. These types of controls are often provided to minimize power consumption, allow for clean power up sequences of the chip, and to provide protection during fault conditions.

For this simple example, there are numerous examples of verification requirements. These requirements can be separated into several categories:
  operating function—do the amplifier and mux meet their respective functional requirements
    does the mux correctly pass the selected input signals to the mux output
    does the amplifier meet it's expected behavior: gain, slew rate, input range, output range, etc.
  power supply and biasing
    is the block connected to the appropriate power supply and receiving the correct biasing
    is the supply and biasing available when expected and operating within the expected range
  control signals
    for every setting of control signals, is the correct behavior observed
  fault conditions
    when any of the block pins behaves in an manner outside allowed or expected ranges, does the block behave appropriately or is that condition either not possible (prevented elsewhere) or not expected to be handled Within the context of this patent, much of the value results from more efficiently managing the process of stepping through many combinations of possibilities. One of the best examples is just stepping through large numbers of digital control or trim options.

Consider this simple example within the context of a larger SOC and a top-level test bench for this SOC. This test bench may be one of many test benches for the chip, but this example can show how verification intellectual property developed for the amplifier can be leveraged even from a top-level test bench. The hierarchical concepts illustrated in FIG. 6 can be populated to show how an example test bench can be built. In this example A1 from FIG. 6 will represent the top-level test bench that includes the chip, all the necessary circuits or models to represent the system inputs, output loads, and external power supplies or other components for the chip, as well as portions of the tests configuration that can be described programmatically through software. This example hierarchy can be seen in the diagram in FIG. 6. As discussed previously, each item in the hierarchy can be represented by multiple types of views depending on the information available and the intended purpose of the block.

The second level of hierarchy in this example that correlates to level "B" in FIG. 6 will include all the elements placed in this top-level test bench. The first element will be the chip itself. In this example, the chip is identified as cell B1. B2 could be a cell that contains circuits or models to represent the system inputs to the chip. B3 could be a cell that contains circuits or models to represent the system provided power supplies and system output loads seen by the chip. B4 in this example will be a block written in software to connect either directly to pins of the chip or other blocks, provide values to any parameterized functions within any of the blocks, and/or monitor and measure specific performances during the simulation. In this simplified example, only signals that lead to the creation of the signals in the lower level example amplifier block are included.

This block B4 (or blocks) that can be captured in software will typically use high-level languages targeted at integrated circuit design (SystemVerilog, Verilog, Verilog-AMS, Verilog-A, SystemC, VHDL, etc.) but can also leverage more general languages and scripts such as C, C++, TCL, PERL, etc. The software portions may create stimulus, define design values for parameters in existing circuit or system blocks, or measure and monitor performance throughout the simulation. For example, the Universal Verification Methodology (UVM) for SystemVerilog includes common constructs for defining monitoring and scoreboard functions as well as defining stimulus. Digital verification methodology also includes numerous specific pieces of verification intellectual property (VIP) that are targeted to specific functions or protocols. For instanced defined communication standards such as Universal Serial Bus (USB), Serial Peripheral Interface (SPI) bus, etc. will have specific verification IP that can be leveraged during the verification process both to supply data through the interface and also test and validate that the interface is matching the protocol standards. In this example, the digital trim and controls will be assumed programmed through a SPI interface or by the chip itself.

Figure 12:
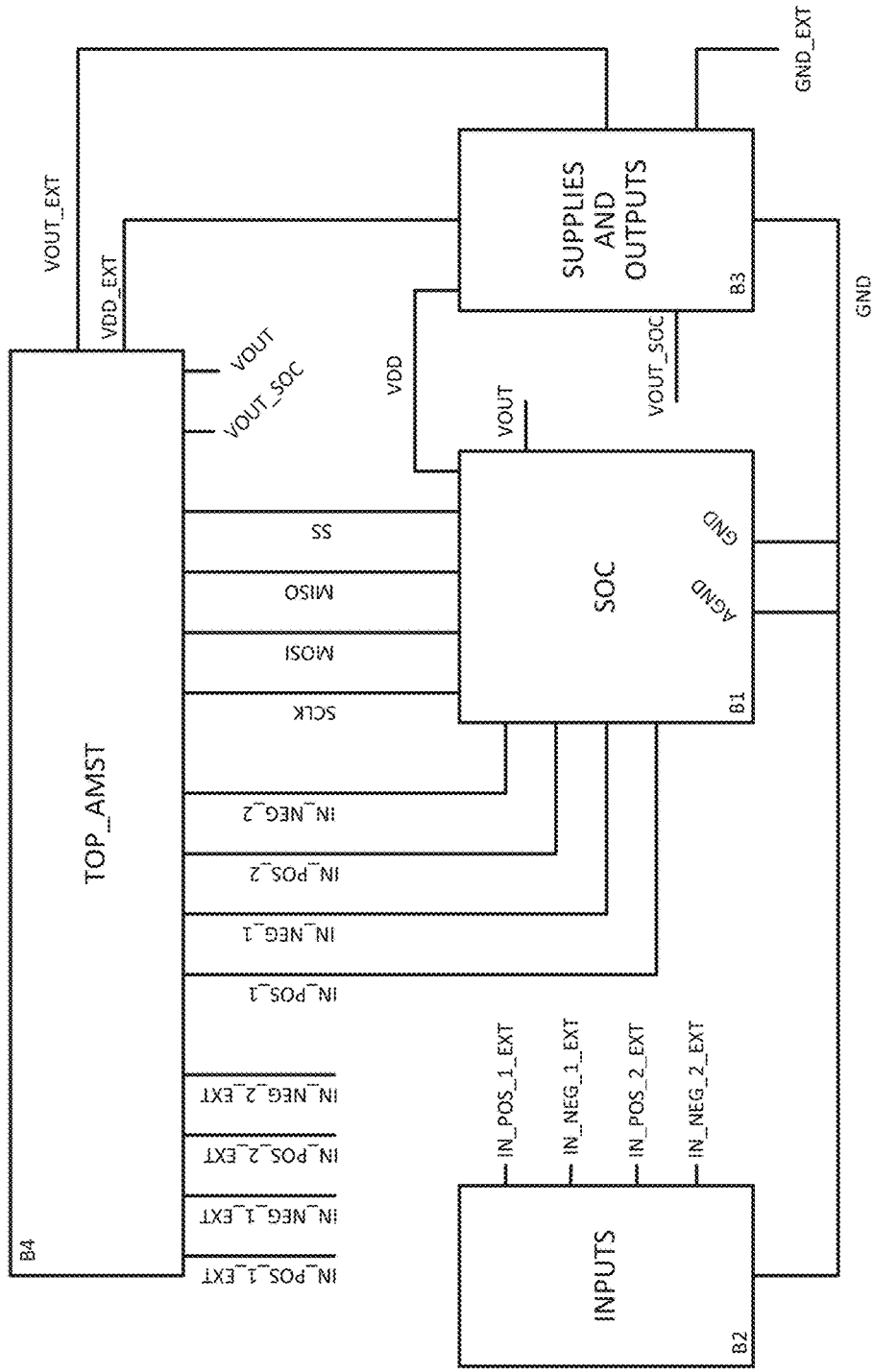
FIG. 12 depicts a B level example of translating verification subroutine commands of an electronic design.
Figure 13:
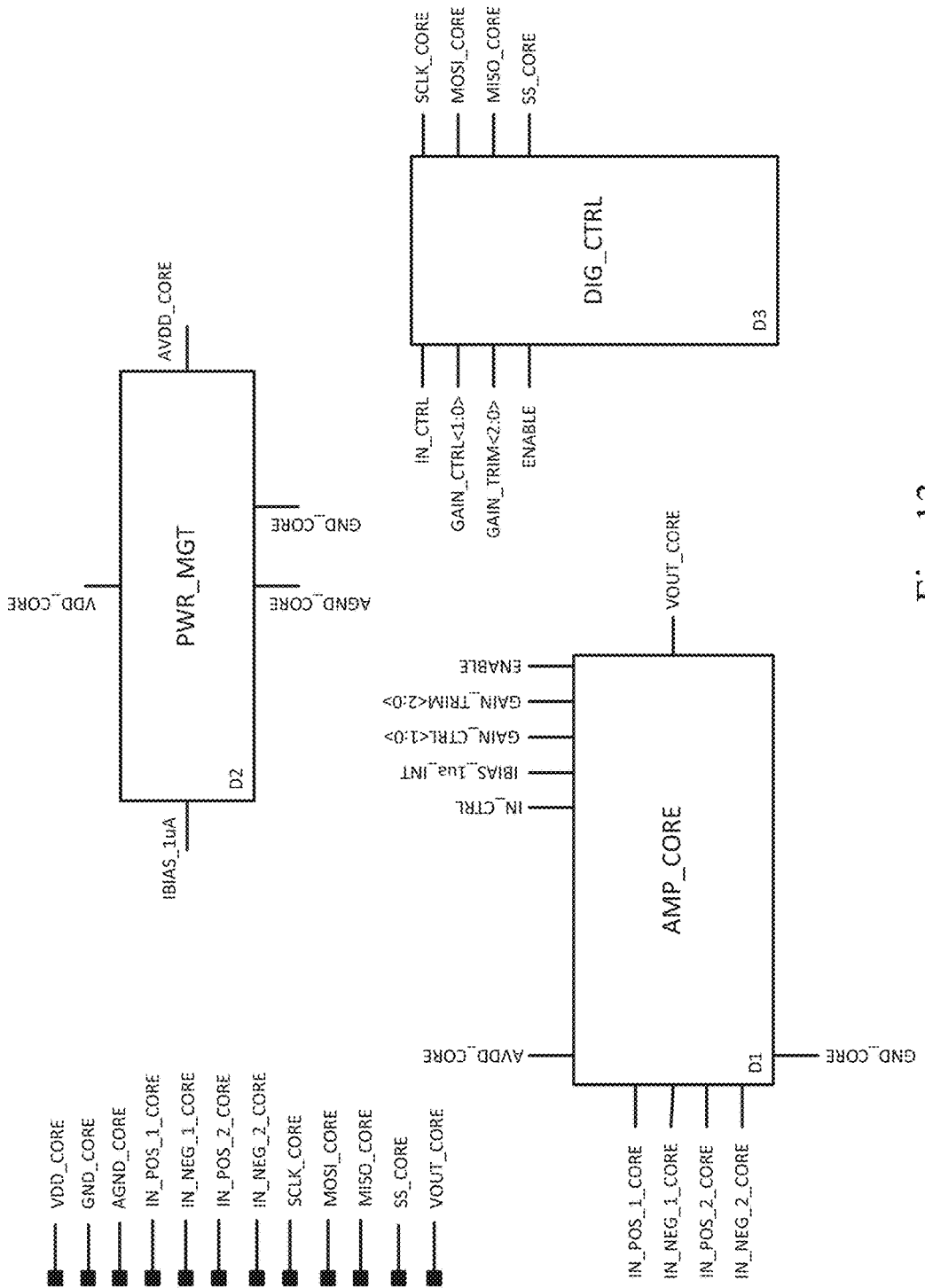
FIG. 13 depicts a D level example of translating verification subroutine commands of an electronic design.

In the testbench of FIG. 12, the external power supply VDD_EXT is being generated by Verilog-A code within the TOP_AMST. Then VDD_EXT is an input for the SUPPLIES_AND_OUTPUTS block. That block then outputs VDD which is connected to the SOC as the primary external power supply. For the inputs, the system inputs are generated within the INPUTS block and then passed through the TOP_AMST block before connecting to the SOC. Passing the inputs through the test harness allows both the voltage and current of the input signals to be monitored (or used as parameters for other calculations) throughout the simulation. Similarly VOUT from the SOC is passed through the TOP_AMST before entering the SUPPLIES_AND_OUTPUTS block. Finally, the VOUT_EXT is fed from the SUPPLIES_AND_OUTPUTS block to the TOP_AMST for monitoring. The decisions on which signals should be passed through the AMST test harness blocks are highly dependent on the system and the amount of circuits/models required around the chip to adequately represent the full system. Ultimately these decisions are driven by the system design and the verification plan.

Figure 14:
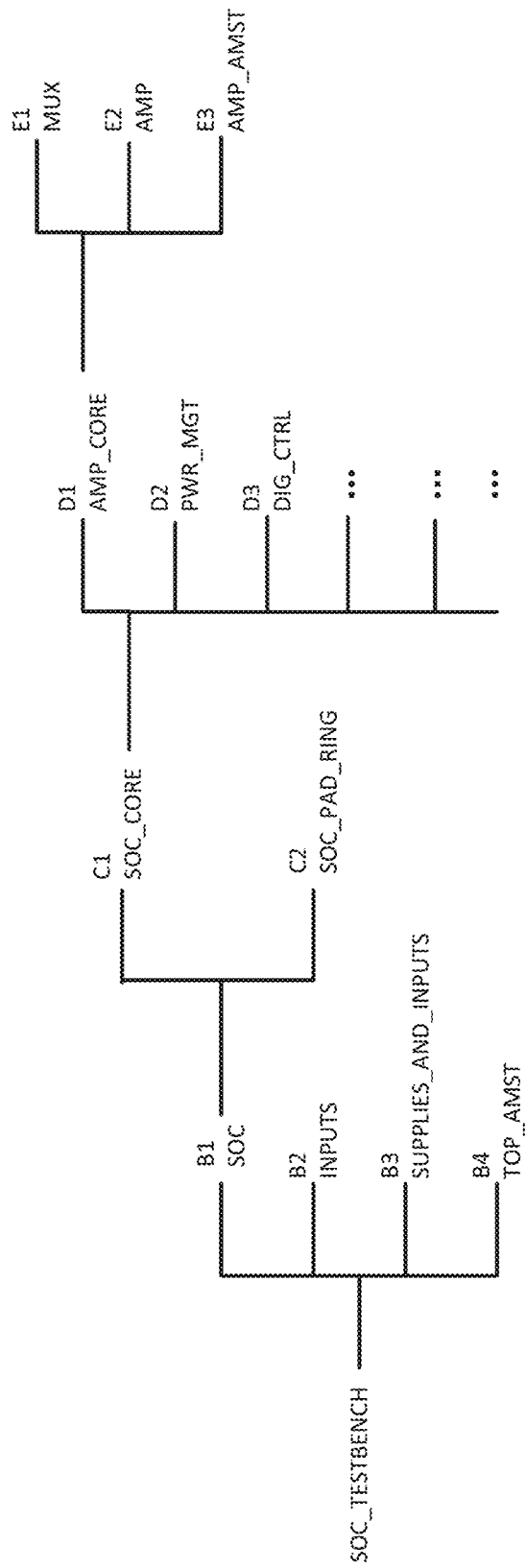
FIG. 14 depicts a hierarchical example of translating verification subroutine commands of an electronic design.

In FIG. 14, signals at lower levels of the hierarchy cannot be accessed unless those signals are brought to a pin at the top-level. Consider further the hierarchy of Instance B1 which represents the chip. In this example, the next level of the chip's hierarchy will contain C1, the SOC_CORE, and C2, the SOC_PAD_RING. Then push down into C1 to see D1, the AMP_CORE subsystem from above; D2, PWR_MGT (power management functions for the chip); and D3, DIG_CTRL.

Figure 15:
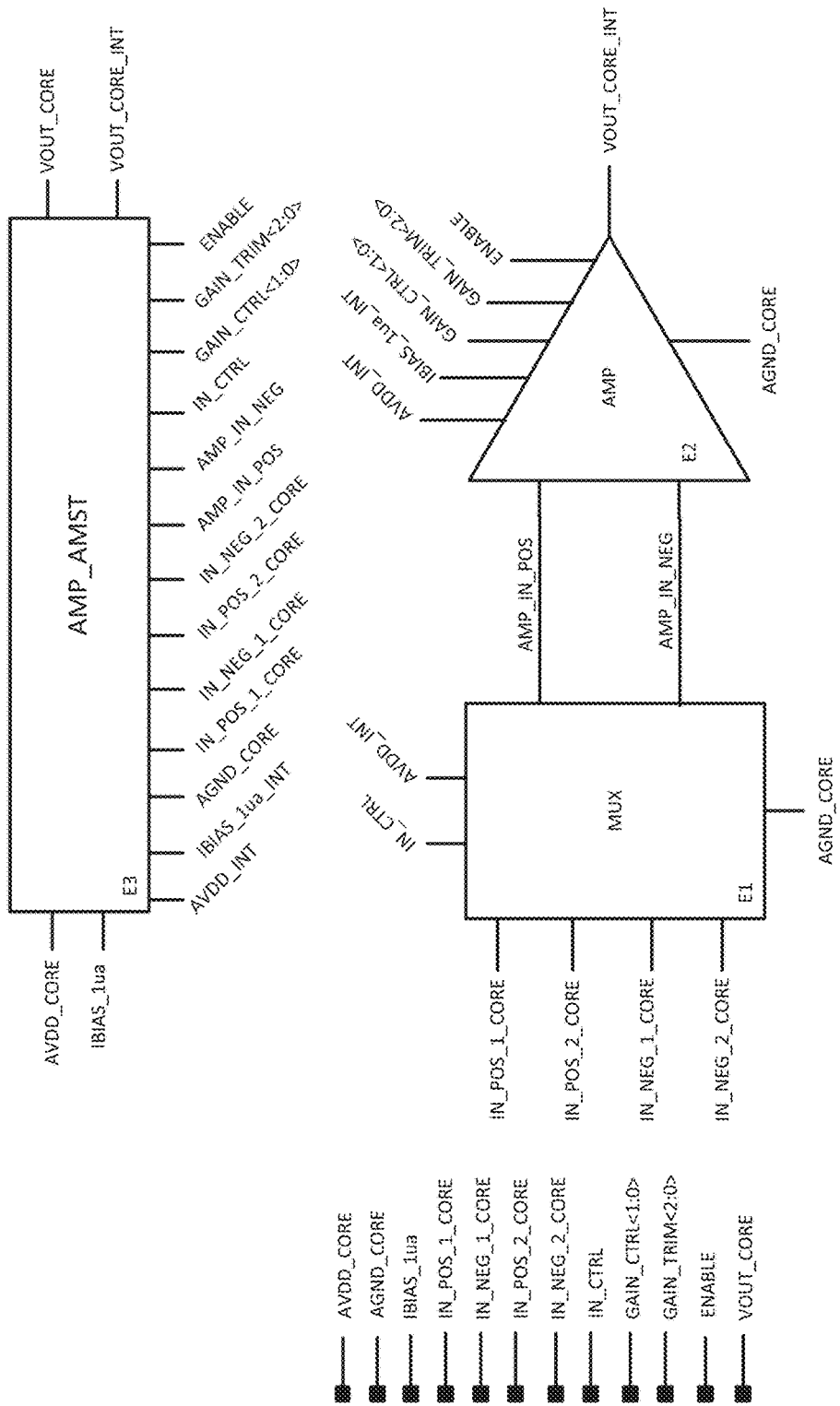
FIG. 15 depicts an E level example of translating verification subroutine commands of an electronic design.

In FIG. 15, Further descending into the AMP_CORE subsystem shows the subsystem elements: E1, the MUX; E2, the AMP; and E3, the AMP_AMST which is a VerilogAMS block containing verification IP for this subsystem.

Consider the case of a simple bandgap with digital trim bits. The purpose of the circuit is to generate a predictable output voltage over environmental (e.g. temperature) variation and process (e.g. oxide thickness) variation. The digital trim bits offer a range of output values with predictable step size. The AMST for this bandgap needs to define the entire test circuit for the bandgap including power supplies, load components, and digital trim values. For starters, let's take a look at a definition of a simple supply:

```
# supply start ramp time
  my $glSupplyRampStartObj =
$glAMSTObj->create_variable("glSupplyRampStartDbl", 50e-9);
  # supply stop ramp time
  my $glSupplyRampEndObj =
$glAMSTObj->create_variable("glSupplyRampEndDbl", 100e-9);
  # supply voltage value
  my $glAvddValObj =
$glAMSTObj->create_variable("glAvddValDbl", 5);
  # create PWL for supply
  $glAMSTObj->create_vpwl(
    "arP0" => "AVDD",
    "arP1" => "AVSS",
    "arPwlRef" => [
      0, 0,
      $glSupplyRampStartObj, 0,
      $glSupplyRampEndObj,
      $glAvddValObj
    ]
  );
```

This example creates a simple piece-wise linear supply that is 0V at t=0, 0V at t=50 ns, 5V at t=100 ns. Notice that all the variables are parameterized. A program can read in this AMST file and then extract a list of variables and their types. This capability allows the user to modify/sweep these values and build a variety of test vectors from the same group of AMST test benches. Additional circuit components can also be instantiated by reference. For example, the code below adds a Verilog-A load resistor to the bandgap:

```
# define the load resistor programmatically
$glAMSTObj->add_module_instance(
    "arModuleName" => "resistor",
    "arModuleFilename" => "behav_resistor.va",
    "arParameterValueMap" => {
        "r" => $glOutputLoadObj
    },
    "arNodeNetMap" => {
        "IN_NODE0" => "VBG",
        "OUT_NODE1" => "AVSS",
    }
);
```

The bandgap needs to be tested for all possible trim bit combinations. The following syntax sets up a full factorial experiment on all the trim bits:

```
# test all possible combinations of the digital inputs
$glAMSTObj->create_voltage_full_factorial(
    "arFactDelay" => $glSupplyRampEndObj,
    "arFactStateValRef" => [0, $glAvddValObj],
    "arFactStateDurRef" => [0.50, 0.50],
    "arFactChgTimeRef" => [2e-9, 2e-9],
    "arFactMinPeriod" => 10e-6,
    "arFactSignalRef" => [
        { "arP0"=>"DTRIM[0:2]",
          "arP1"=>"AVSS"}
    ]
);
    gets expanded into:
module amst(...)
    output [2:0] DTRIM;
    electrical [2:0] DTRIM;
    output AVSS;
    electrical AVSS;
    parameter real glSupplyRampEndDbl = 1e-07;
    parameter real glAvddValDbl = 5;
    real loDtrimVal2loAvssValBit0;
    real loDtrimVal2loAvssValBit1;
    real loDtrimVal2loAvssValBit2;
    analog begin
        @ (initial_step) begin
            loDtrimVal2loAvssValBit0 = 0;
            loDtrimVal2loAvssValBit1 = 0;
            loDtrimVal2loAvssValBit2 = 0;
        end
        ...
        // DTRIM[0]
        @(timer(glSupplyRampEndDbl, 1e-05, 1p))
            loDtrimVal2loAvssValBit0 = 0;
        @(timer((glSupplyRampEndDbl + 0.5 * 1e-05), 1e-05, 1p))
            loDtrimVal2loAvssValBit0 = glAvddValDbl;
        V(DTRIM[0], AVSS) <+ transition(loDtrimVal2loAvssValBit0, 0, 2e-09, 2e-09);
        // DTRIM[1]
        @(timer(glSupplyRampEndDbl, (1e-05 * 2), 1p))
            loDtrimVal2loAvssValBit1 = 0;
        @(timer((glSupplyRampEndDbl + (0.5 * 1e-05 * 2)), (1e-05 * 2), 1p))
            loDtrimVal2loAvssValBit1 = glAvddValDbl;
        V(DTRIM[1], AVSS) <+ transition(loDtrimVal2loAvssValBit1, 0, 2e-09, 2e-09);
        // DTRIM[2]
        @(timer(glSupplyRampEndDbl, (1e-05 * 4), 1p))
            loDtrimVal2loAvssValBit2 = 0;
        @(timer((glSupplyRampEndDbl + (0.5 * 1e-05 * 4)), (1e-05 * 4), 1p))
            loDtrimVal2loAvssValBit2 = glAvddValDbl;
        V(DTRIM[2], AVSS) <+ transition(loDtrimVal2loAvssValBit2, 0, 2e-09, 2e-09);
        ...
endmodule
```

The definition above states that there are 3 trim signals. Each signal has 2 valid values that need to be tested. A full factorial will enumerate all possible states. Thus, for 3 binary variables, you get a set of 8 periods that test all valid signal combinations. Once the test circuit and the stimulus has been defined, the measurements and assertions need to be defined. An example of a simple voltage measurement:

```
my $glVbgTrim0MeasObj = $glAMSTObj->create_voltage_measure(
    "arMeasureNet" => "VBG",
    "arRefNet" => "AVSS",
    "arMinVal" => 0.850,
    "arMaxVal" => 0.900
);
```

This voltage measurement is true whenever the output node VBG is between 0.850 and 0.900. This measurement is performed and evaluated at every time step of the simulation. A collection of boolean measurements can be combined to create conditional assertions. For example, the assertion below states that when the DTRIM[2:0] bits are at "000" and the VDD supply is above its minimum threshold, the $glVbgTrim0MeasObj measurement defined above (0.850<=VBG<=0.900) must be true.

```
# when DTRIM="000" => VBG=0.9
$glAMSTObj->create_conditional_assert(
    "arAssertNameStr" => 'when DTRIM=\"000\" => VBG=0.9',
    "arCondition" => assert_and(
        $glVddAboveMin,
        assert_not($glDtrim0MeasObj),
        assert_not($glDtrim1MeasObj),
        assert_not($glDtrim2MeasObj)
    ),
    "arAssertDelay" => $loMeasureDelayDbl,
    "arAssert" => assert_and(
        $glVbgTrim0MeasObj,
        $glPgoodMeasObj
    ),
    "arAssertAtLeastOnce" => 1
);
```

It would have been simpler to measure the output voltage at some point in time (e.g. VBG must be between 0.850 and 0.900 at 100 us). This type of check is also easily implementable in AMSTL. But the assertion above is much more powerful because it explicitly captures a subset of the bandgap spec (e.g. "when DTRIM=000=>VBG=0.9") and validates that this part of the spec is true whenever the assertion conditions have been satisfied, not just at a single point in time.

In the next example code below generates direct branch contribution statements for the purpose of measurement. In this example, we have a 16 wire bus of reference currents. We use the syntax below to insure the current is between 0.9*750 nA and 1.1*750 nA after 1 us.

```
zip_setup_std_supplies(
    50e-09, 100e-09,
    [
        ["Ib_750n_AMST_IN[0:15]", "Ib_750n_AMST_OUT[0:15]", 0]
    ]
),
zip_assert_output_currents(
    0.9, 1.1, 1e-06,
    {
        "Ib_750n_AMST_IN[0:15]" => 750e-09
    }
);
...
parameter real loSupplyRampStartDbl = 5e-08;
parameter real loSupplyRampEndDbl = 1e-07;
```

```
parameter real loIb_750n_AMST_INValDbl = 0;
parameter real arVolEnGndMin1 = 2.85;
parameter real arVolEnGndMax1 = 3.15;
parameter real arCurIb_750n_amst_in0Min1 = 6.75e-07;
parameter real arCurIb_750n_amst_in0Max1 = 8.25e-07;
real loChangeTimeV1;
real loIb_750n_amst_inValBit0;
// create analog conditional assert 1
integer loVolEnGndAboveMin1;
integer loVolEnGndAboveMax1;
integer loCurIb_750n_amst_in0AboveMin1;
integer loCurIb_750n_amst_in0AboveMax1;
integer loCondition1;
integer loOldCondition1;
integer loSat1;
integer loFail1;
integer loDisplay11;
integer loAssert1;
integer loMeasure1;
real loCheckTime1;
integer loAssertOutOn1;
analog begin
        @ (initial_step) begin
            loChangeTimeV1 = 0;
            loIb_750n_amst_inValBit0 = 0;
            // create analog conditional assert 1
            loVolEnGndAboveMin1 = 0;
            loVolEnGndAboveMax1 = 0;
            loCurIb_750n_amst_in0AboveMin1 = 0;
            loCurIb_750n_amst_in0AboveMax1 = 0;
            loCondition1 = 0;
            loOldCondition1 = 0;
            loSat1 = 0;
            loFail1 = 0;
            loDisplay1 = 0;
            loAssert1 = 0;
            loMeasure1 = 0;
            loCheckTime1 = 0;
            loAssertOutOn1 = 0;
        end
            V(NEG_Ib_750n_amst_in0, Ib_750n_AMST_OUT[0]) <+
transition(loIb_750n_amst_inValBit0, 0, loChangeTimeV1, loChangeTimeV1);
            V(Ib_750n_AMST_IN[0], NEG_Ib_750n_amst_in0) <+ 0;
            // CURRENT: when 2.85<EN<3.15 ==> 6.75e-07 < Ib_750n_AMST_IN[0] < 8.25e-07
            loDisplay1 = 1;
            'ZIP_VCROSS_TO_BLN(EN, GND, arVolEnGndMin1, loVolEnGndAboveMin1);
            'ZIP_VCROSS_TO_BLN(EN, GND, arVolEnGndMax1, loVolEnGndAboveMax1);
            'ZIP_ICROSS_TO_BLN(Ib_750n_AMST_IN[0], NEG_Ib_750n_amst_in0,
arCurIb_750n_amst_in0Min1, loCurIb_750n_amst_in0AboveMin1);
            'ZIP_ICROSS_TO_BLN(Ib_750n_AMST_IN[0], NEG_Ib_750n_amst_in0,
arCurIb_750n_amst_in0Max1, loCurIb_750n_amst_in0AboveMax1);
            loCondition1 = (loVolEnGndAboveMin1 && !loVolEnGndAboveMax1);
            if (loCondition1 && !loOldCondition1) begin
                loAssertOutOn1 = 0;
                loCheckTime1 = $abstime + 1e-06;
            end
            @(timer(loCheckTime1)) begin
                loAssertOutOn1 = 1;
            end
            loAssert1 = (loCurIb_750n_amst_in0AboveMin1 &&
!loCurIb_750n_amst_in0AboveMax1);
            if (loCondition1 && loAssertOutOn1) begin
                loMeasure1 = loAssert1;
                if ((loSat1 && !loFail1 && loMeasure1) || (!loSat1 && loFail1 && !loMeasure1))
begin
                    loDisplay1 = 0;
                end
                if (loDisplay1) begin
                    if (loMeasure1) begin
                        loSat1 = 1;
                        loFail1 = 0;
                        $fdisplay(fileDescriptor, "CURRENT: when 2.85<EN<3.15 ==> 6.75e-07<
Ib_750n_AMST_IN[0] < 8.25e-07 succeeds %e", $abstime);
                    end else begin
                        loSat1 = 0;
                        loFail1 = 1;
```

-continued

```
    $fdisplay(fileDescriptor, "CURRENT: when 2.85<EN<3.15 ==> 6.75e–07 <
Ib_750n_AMST_IN[0] < 8.25e–07 fails %e", $abstime);
            end
          end
        end
        loOldCondition1 = loCondition1;
end
```

Figure 16:
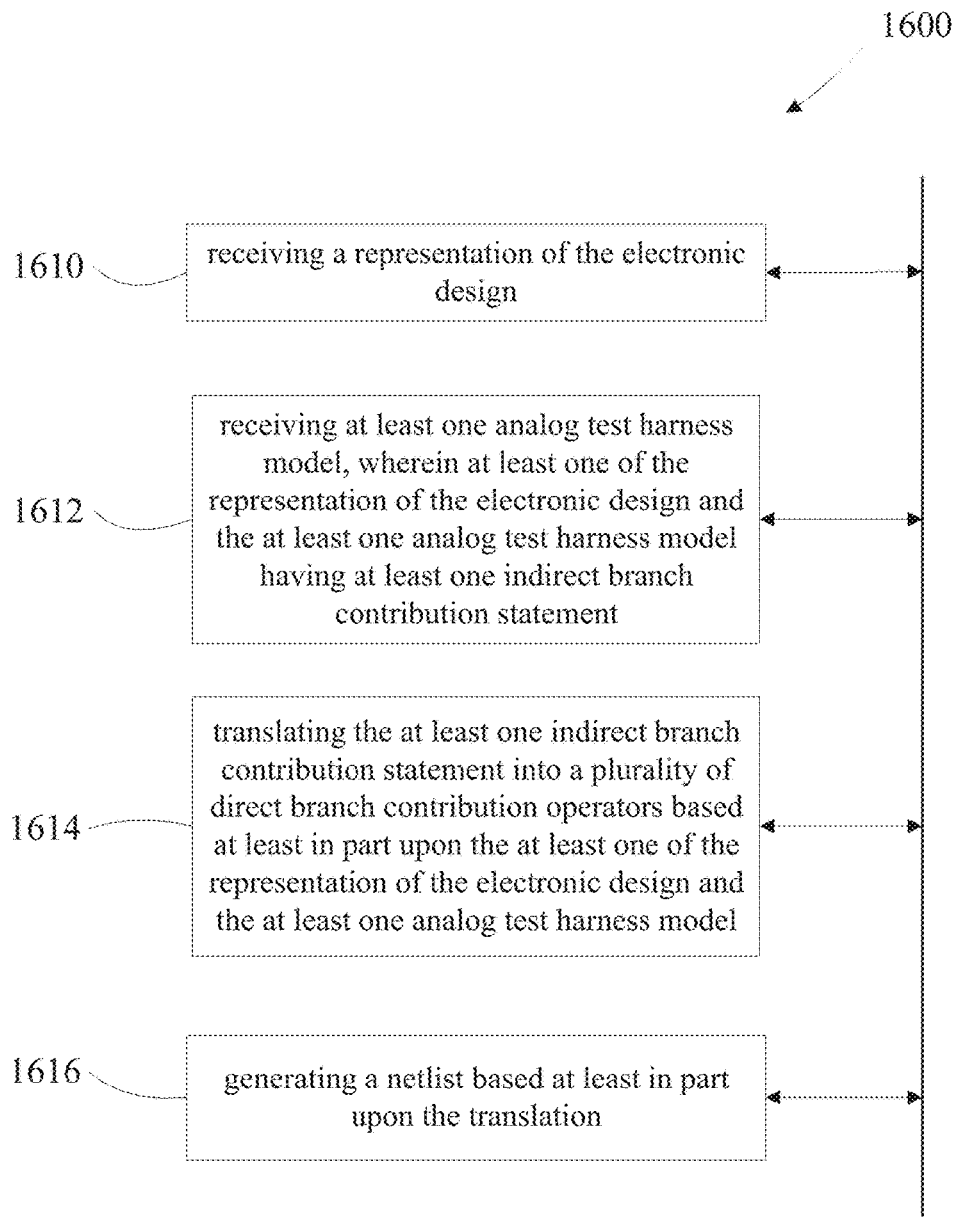
FIG. 16 depicts a first example of translating verification subroutine commands of an electronic design.

In one example, FIG. 16 illustrates an electronic design to netlist computer implemented method 1600 of translation of verification commands of an electronic design that comprises the steps of receiving 1610 the electronic design and receiving 1612 at least one analog test harness model having at least one indirect branch contribution statement. The method also comprises the steps of translating 1614 the at least one indirect branch contribution statement into a plurality of direct branch contribution operators based at least in part upon the at least one analog test harness model and generating 1616 a netlist based at least in part upon the translation. The electronic design may encompass multiple levels of hierarchy. The analog test harness may exist as a module at the lowest level, in which it acts as a packaged test-bench along with the circuit to any of the hierarchical levels. Referring back to FIG. 6, the electronic design would encompass each connected block in the figure which incorporates different hierarchical levels. The top level hierarchy is A1, the next level of hierarchy is B, which includes B1 and B2 and underneath the B hierarchy is the C hierarchy having C1, C2 and C3. In this specific example at the B1 level and below the model is comprised of Schematic and Spice models. At the B2 level the model encompasses Schematic_behavioral and Behavioral_va models. In this instance the analog test model would be connected to A1, instance 1 level and would be connected through the netlist, connecting lines to each of the components under test.

In one example, the indirect branch contribution statements may be looping in which a sequence of instructions are repeated until an exit condition is met. The indirect statement may also be conditional in which an action is taken based on a true or false Boolean condition, nomenclature based in which the naming of the input, output or device is parsed and infers a set of instructions and analysis based in which either an output or input to a net is analyzed and a decision is made based upon the analysis.

The analog test harness model may be located at any level in the hierarchy of the design from the top block level to an individual circuit and the like. One example of the analog test harness model is one in which it is described within a low level block and forms a module within the design in which the testing module is included within the individual block. One possible benefit associated with including the analog test harness model within an individual block is that it may be sent with the circuit design to support a self-verification within the module.

In one example, the netlist provides the connectivity of the electronic design, in essence which terminals on one device are connected to which terminals on another device. The netlist may also contain device specifics for each of the devices.

In one example, the translation of the indirect branch contribution statement into multiple direct branch contribution operators based on the analog test harness model is a conversion of one blanket statement into a series of individual statements that encompass the span of the blanket statements. In essence on statement "index conditions<1: 10>" would be broken into "condition 1", "condition 2" . . . "condition 10".

The translation may utilize a standardized analog hardware description language that may comprise at least of at least one of Verilog-A™ syntax and Verilog-AMS™ syntax.

Figure 17:
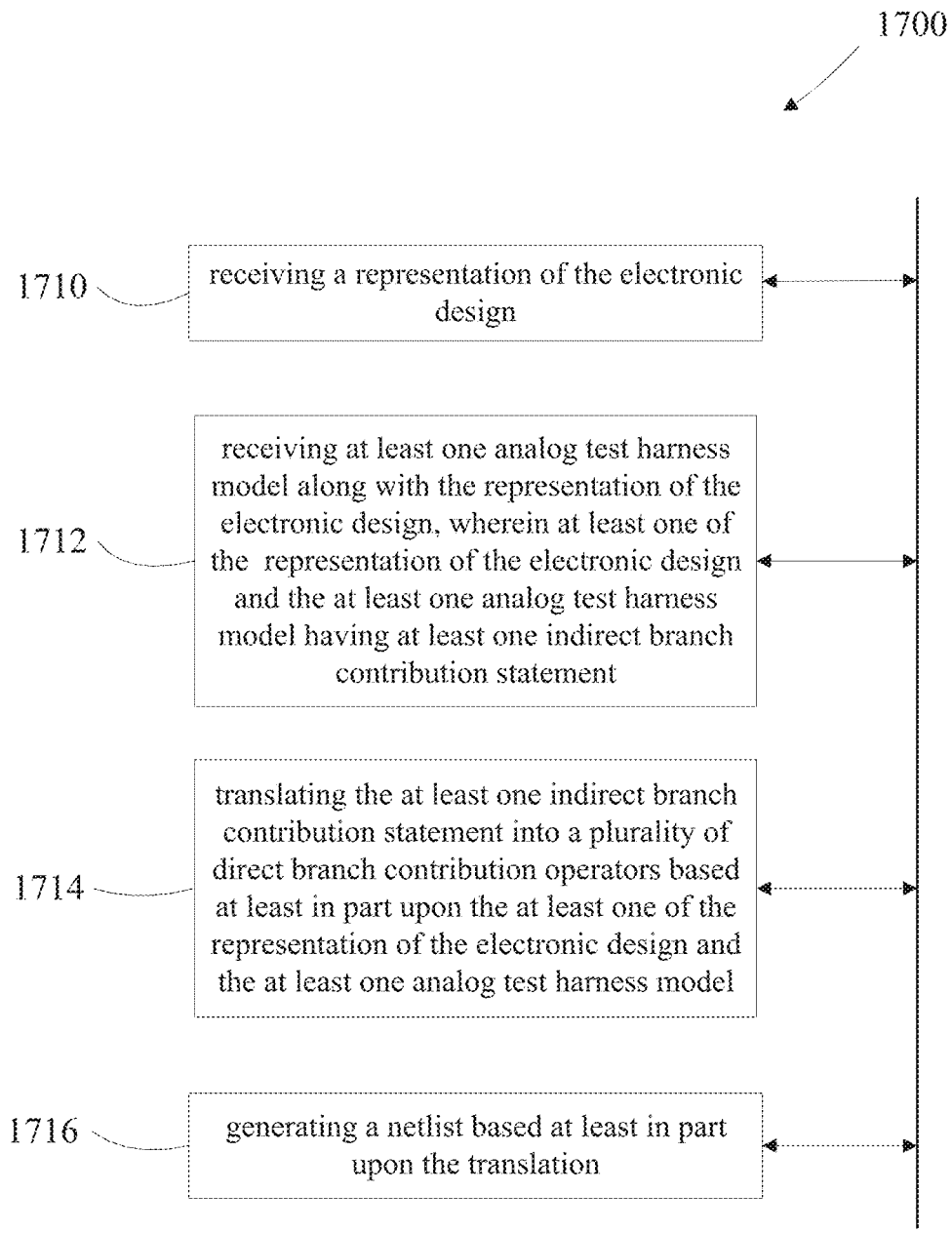
FIG. 17 depicts a second example of translating verification subroutine commands of an electronic design.

In another example, FIG. 17 illustrates an electronic design to netlist computer implemented method 1700 of translation of verification commands of an electronic design which comprises the steps of, receiving 1710 a representation of the electronic design and receiving 1712 along with the representation of the electronic design, at least one analog test harness model having at least one indirect branch contribution statement. The method further comprises translating 1714 the at least one indirect branch contribution statement into a plurality of direct branch contribution operators based at least in part upon the at least one analog test harness model and the electronic design and generating 1716 a netlist based at least in part upon the translation. Referring back to FIG. 7, each of the hierarchies and models of the example design are shown. One of the goals of verification is to test each block and each model of the design at appropriate conditions. Translating indirect branch contribution statements aids in this multi-dimensional task by automating at least a portion of the cycling.

The at least one analog test harness model may have at least one stimulus, at least one stimulus assertion, at least one output assertion and/or at least one output measurement. The representation of the electronic design may be analog or mixed signal, may comprise at least one transistor level circuitry, at least one behavioral modeled circuitry, at least one circuit based upon at least one parasitic model based at least in part upon a physical design and/or at least one behavioral modeled circuit.

Figure 18:
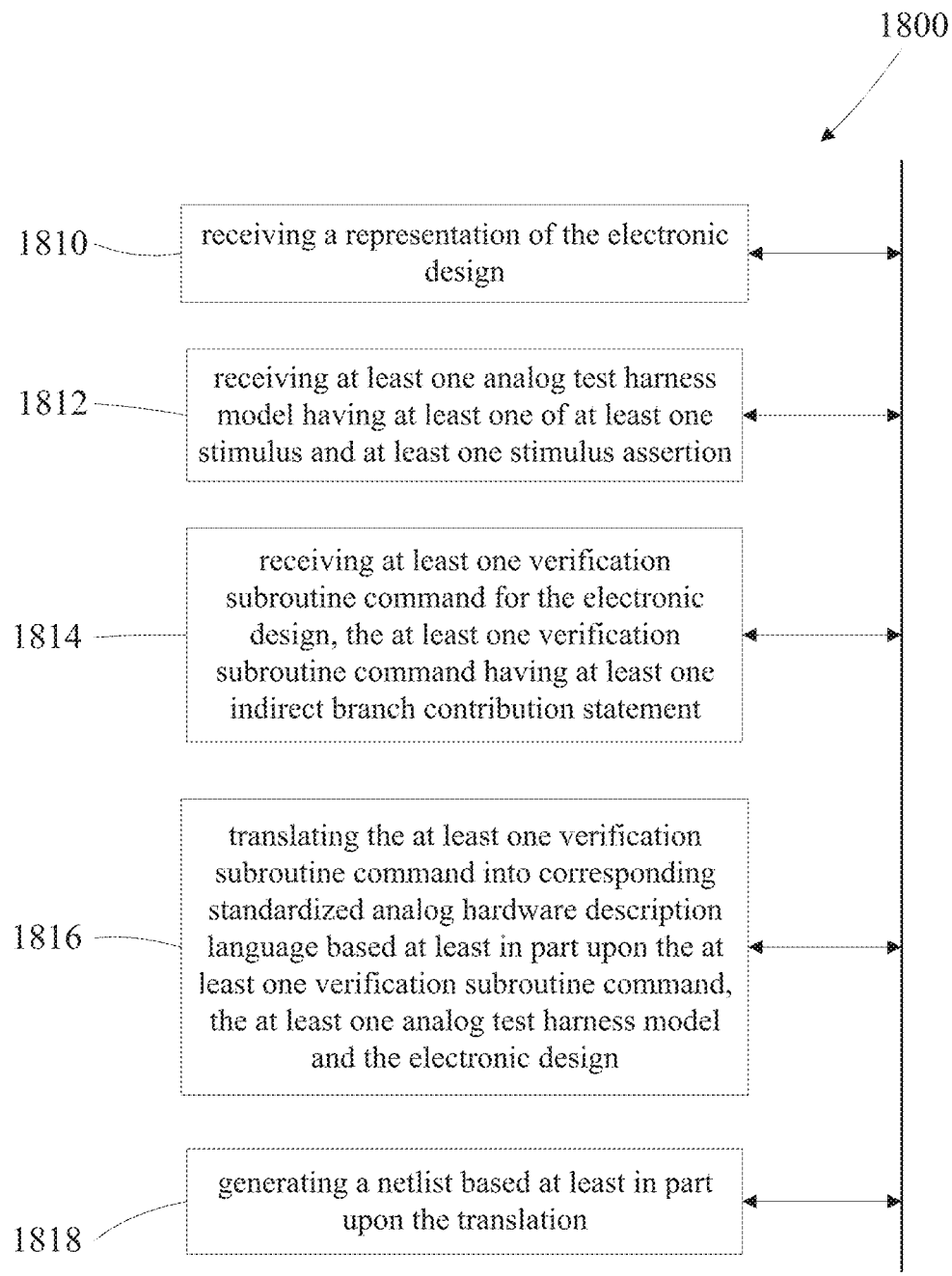
FIG. 18 depicts a third example of translating verification subroutine commands of an electronic design.

In another example, FIG. 18 illustrates an electronic design to netlist computer implemented method 1800 of translation of verification commands of an electronic design that comprises the steps of receiving 1810 a representation of the electronic design, receiving 1812 at least one analog test harness model having at least one of at least one stimulus and at least one stimulus assertion and receiving 1814 at least one verification subroutine command for the electronic design, the at least one verification subroutine command having at least one indirect branch contribution statement. The method also comprises the steps of translating 1816 the at least one verification subroutine command into corresponding standardized analog hardware description language based at least in part upon the at least one verification subroutine command, the at least one analog test harness model and the electronic design and generating 1818 a netlist based at least in part upon the translation. A stimulus assertion may define property definitions, constraints and the like within an electronic system. Referring back to FIG. 8, the electronic design would encompass each of the connected blocks following the PMIC_testbench, and at least one analog test harness model would pertain to the block marked PMIC_testbench. The netlist for that model would indicate each connection, connecting line in FIG. 8. The hierarchies associated with this design indicate that the LDO, Battery Supervisor and Voltage Reference blocks are lower in hierarchy than the PMIC block. Additionally, this model primarily reviews the schematic portion of the design. The ability to translate at least one indirect branch contribution statement into a plurality of direct branch contribution operators may increase the efficiency of reviewing each of the hierarchies and each of the portions of the design for each block in the design.

The standardized analog hardware description language may comprise at least of at least one of Verilog-A™ syntax and Verilog-AMS™ syntax. The at least one analog test harness model may have at least one of at least one output assertion and at least one output measurement.

Figure 19:
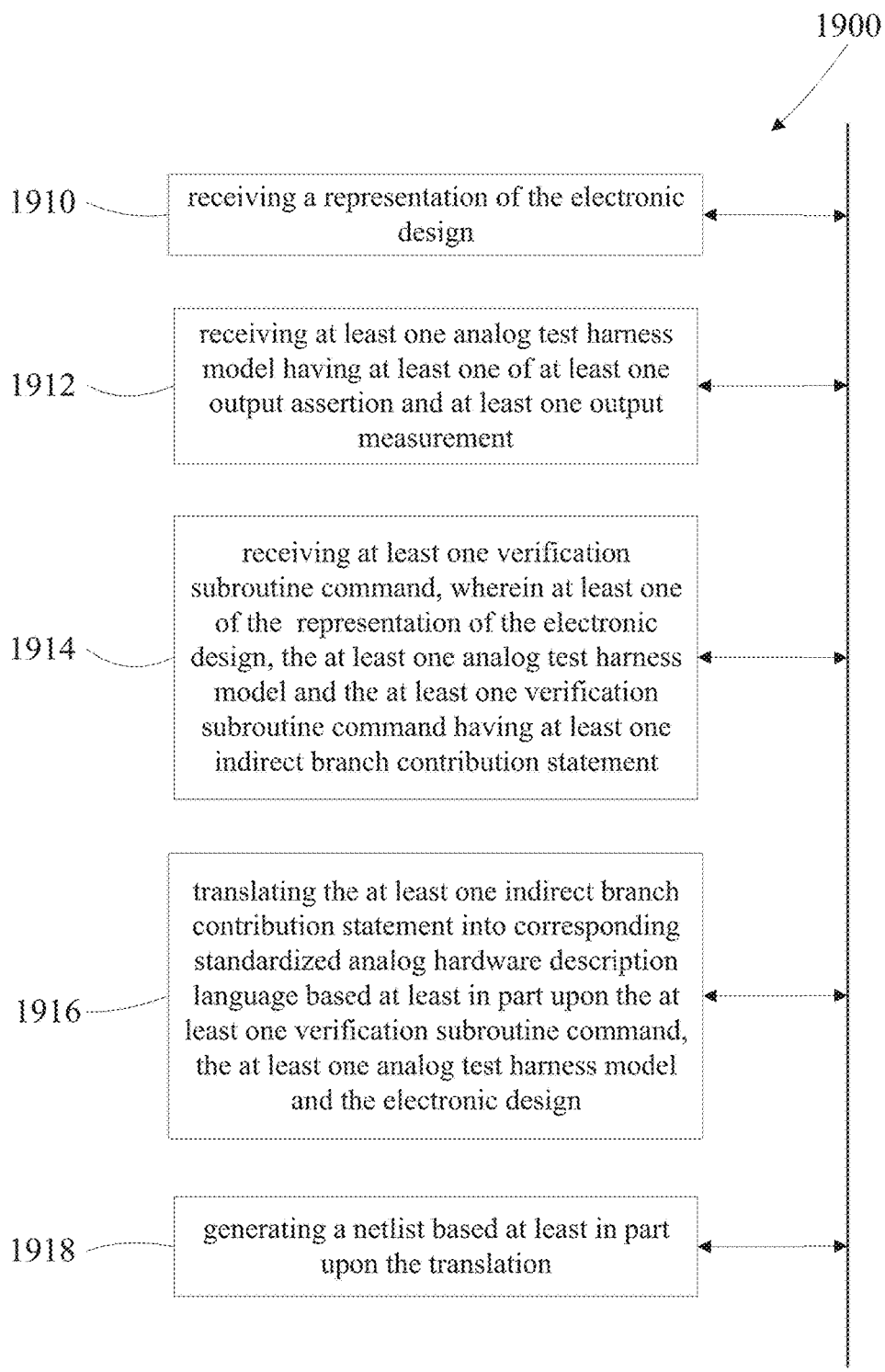
FIG. 19 depicts a fourth example of translating verification subroutine commands of an electronic design.

In another example, FIG. 19 illustrates an electronic design to a netlist via verification subroutines of a computer implemented method 1900 of translation of verification commands of an electronic design which comprises the steps of, receiving 1910 a representation of the electronic design, receiving 1912 at least one analog test harness model having at least one of at least one output assertion and at least one output measurement and receiving 1914 at least one verification subroutine command for the electronic design, the at least one verification subroutine command having at least one indirect branch contribution statement. The method also comprises the steps of translating 1916 the at least one verification subroutine command into corresponding at least one of standardized analog hardware description language based at least in part upon the at least one verification subroutine command, the at least one analog test harness model and the electronic design and generating 1918 a netlist based at least in part upon the translation. Referring back to FIG. 9, the electronic design would encompass each of the connected block following the PMIC_testbench, and at least one analog test harness model would pertain to the block marked PMIC_testbench. The netlist would indicate the connectivity, shown by the lines connecting each of the blocks. The hierarchies associated with this design indicate that the LDO, Battery Supervisor and Voltage Reference blocks are lower in hierarchy than the PMIC block. This model reviews the schematic, schematic behavioral and behavioral.va aspects of the model. Though the overall electronic design is the same as in FIG. 8, what is tested, the hierarchies and connectivity are different. The ability to translate at least one indirect branch contribution statement into a plurality of direct branch contribution operators aids in reviewing the different models and hierarchies in a more thorough manner.

The standardized analog hardware description language may comprise at least of at least one of Verilog-A™ syntax and Verilog-AMS™ syntax. The at least one verification subroutine command may have at least one specification subset. The at least one analog harness model may validate the at least one specification subset based at least in part upon the at least one of at least one output assertion and at least one output measurement. The at least one specification subset may have a data transformation.

Figure 20:
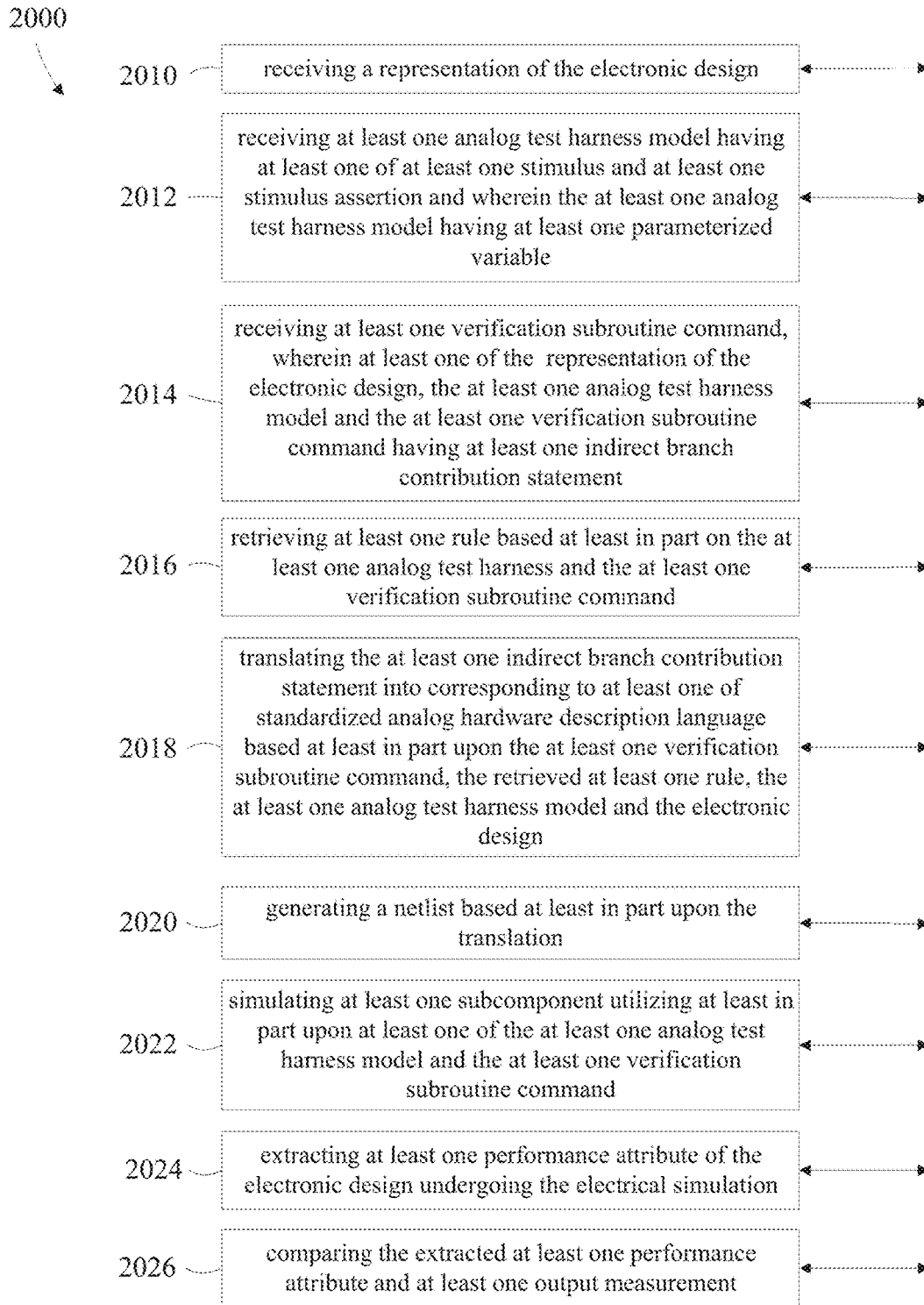
FIG. 20 depicts a fifth example of translating verification subroutine commands of an electronic design.

In another example, FIG. 20 illustrates an electronic design through extracted data comparison computer program product embodied on a non-transitory computer usable medium 2000, the non-transitory computer usable medium having stored thereon a sequence of instructions which, when executed by a processor causes the processor to execute a method of translation of verification commands of an electronic design, the method comprises the steps of, receiving 2010 at least one analog test harness model having at least one of at least one stimulus and at least one stimulus assertion and wherein the at least one analog test harness model having at least one parameterized variable and receiving 2012 at least one verification subroutine command for the electronic design, the at least one verification subroutine command having at least one indirect branch contribution statement. The method also comprises the steps of retrieving 2014 at least one rule based at least in part on the at least one analog test harness and the at least one verification subroutine command and translating 2016 the at least one verification subroutine command into corresponding to at least one of standardized analog hardware description language based at least in part upon the at least one verification subroutine command, the retrieved at least one rule, the at least one analog test harness model and the electronic design. The method further comprises the steps of generating 2018 a netlist based at least in part upon the translation, electrically simulating 2020 at least one subcomponent utilizing at least in part the at least one analog test harness model, extracting 2022 at least one performance attribute of the electronic design undergoing the electrical simulation and comparing 2024 the extracted at least one performance attribute and at least one output measurement. Referring back to FIG. 10, the electronic design would encompass each of the connected blocks following the PMIC_testbench, and at least one analog test harness model would pertain to the block marked PMIC_testbench. In this example the PMIC hierarchy and the LDO, Battery Supervisor and Voltage Reference hierarchies are reviewed. At the highest level the PMIC is reviewed at the schematic level and the LDO at the Behavioral_vams, the Battery Supervisor at the Behavioral_vams and the Voltage reference at the Behavioral_va level.

The computer program product may further comprise the steps of fixing the at least one parameterized variable, of varying the at least one parameterized variable in at least one separate simulation run and/or varying the at least one parameterized variable within at least one simulation run. The at least one performance attribute may be extracted during the simulation or extracted after the simulation. The at least one analog test harness model may have at least one of at least one output assertion and at least one output measurement.

Figure 21:
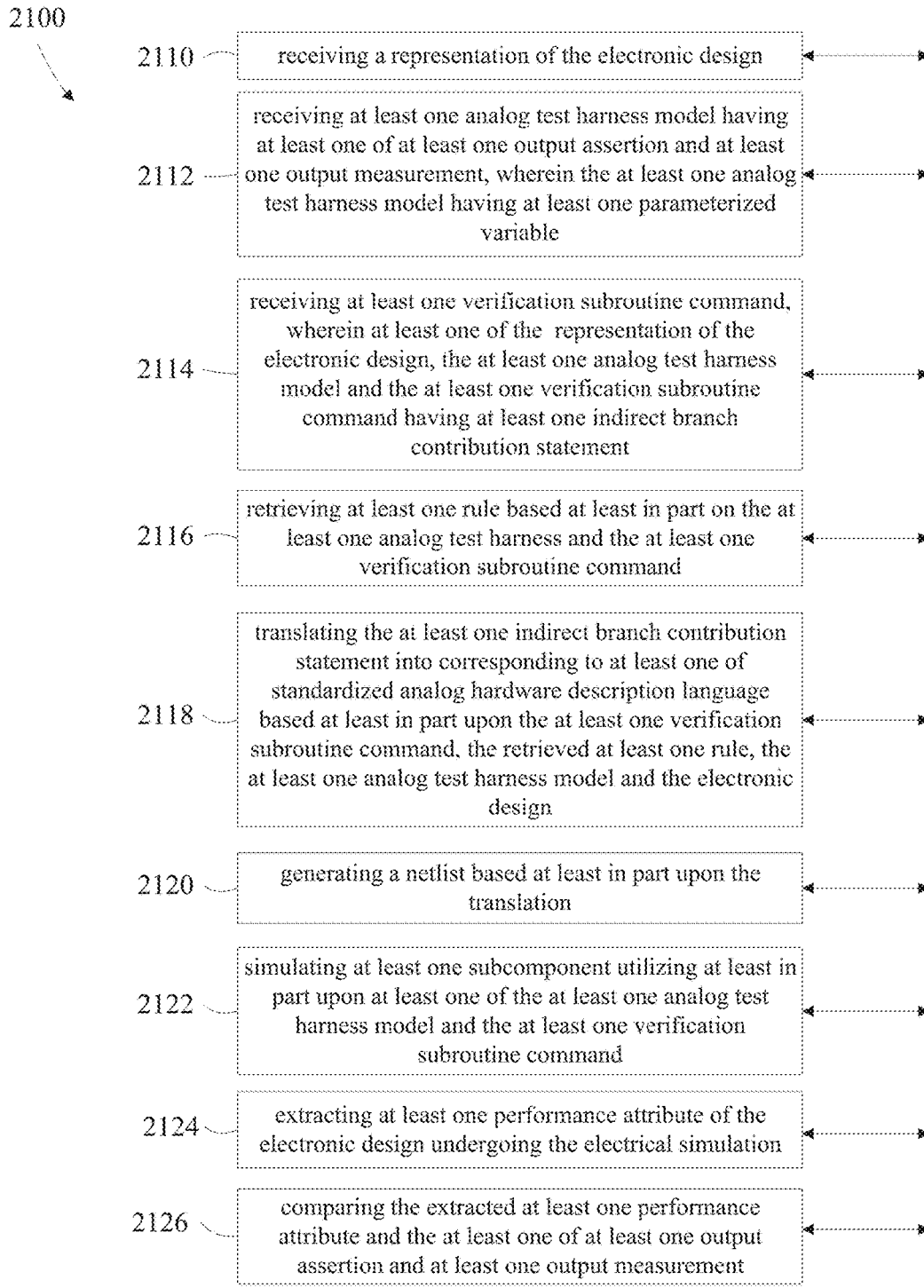
FIG. 21 depicts a sixth example of translating verification subroutine commands of an electronic design.

In another example, FIG. 21 illustrates an electronic design through extracted data comparison of computer program product embodied on a non-transitory computer usable medium 2100, the non-transitory computer usable medium having stored thereon a sequence of instructions which, when executed by a processor causes the processor to execute a method of translation of verification commands of an electronic design, the method comprises the steps of, receiving 2110 at least one analog test harness model having at least one of at least one output assertion and at least one output measurement, wherein the at least one analog test harness model having at least one parameterized variable and receiving 2112 at least one verification subroutine command for the electronic design, the at least one verification subroutine command having at least one indirect branch contribution statement. The method also comprises the steps of retrieving 2114 at least one rule based at least in part on the at least one analog test harness and the at least one verification subroutine command, translating 2116 the at least one verification subroutine command into corresponding to at least one of standardized analog hardware description language based at least in part upon the at least one verification subroutine command, the retrieved at least one rule, the at least one analog test harness model and the electronic design and generating 2118 a netlist based at least in part upon the translation. The method further comprises the steps of electrically simulating 2120 at least one subcomponent utilizing at least in part the at least one analog test harness model, extracting 2122 at least one performance attribute of the electronic design undergoing the electrical simulation and comparing 2124 the extracted at least one performance attribute and the at least one of at least one output assertion and at least one output measurement. Referring back to FIG. 10, the electronic design would encompass each of the connected blocks following the PMIC_testbench, and at least one analog test harness model would pertain to the block marked PMIC_testbench. In this example the PMIC hierarchy and the LDO, Battery Supervisor and Voltage Reference hierarchies are reviewed. At the highest level the PMIC is reviewed at the schematic level and the LDO at the Behavioral_vams, the Battery Supervisor at the Behavioral_vams and the Voltage reference at the Behavioral_va level.

The standardized analog hardware description language may comprise at least one of Verilog-A™ and Verilog-AMS. The method may further comprise the steps of modifying the at least one analog test harness model based at least in part upon a designated outcome, modifying the at least one verification subroutine command based at least in part upon a designated outcome and/or modifying the at least one parameterized variable. The electronic design may result in at least one of at least one active circuit and at least one passive circuit, wherein the electronic design resulting in at least one active circuit may adjust at least one of at least one gain and at least one direction of at least one electrical signal. The at least one verification subroutine command may have at least one specification subset and the at least one analog harness model may validate the at least one specification subset based at least in part upon the at least one of at least one output assertion and at least one output measurement.

While the making and using of various exemplary examples of the disclosure are discussed herein, it is to be appreciated that the present disclosure provides concepts which can be described in a wide variety of specific contexts. Although the disclosure has been shown and described with respect to a certain example, it is obvious that equivalents and modifications will occur to others skilled in the art upon the reading and understanding of the specification. The present disclosure includes such equivalents and modifications, and is limited only by the scope of the following claims.

It is to be understood that the method and apparatus may be practiced locally, distributed or remotely and that the data for steps may be stored either locally or remotely. For purposes of clarity, detailed descriptions of functions, components, and systems familiar to those skilled in the applicable arts are not included. The methods and apparatus of the disclosure provide one or more advantages including which are not limited to, improved speed efficiency, decreased computation time, decreased number of re-verifications and the like. While the disclosure has been described with reference to certain illustrative examples, those described herein are not intended to be construed in a limiting sense. For example, variations or combinations of steps in the examples shown and described may be used in particular cases while not departing from the disclosure. Various modifications and combinations of the illustrative examples as well as other advantages and examples will be apparent to persons skilled in the arts upon reference to the drawings, description, and claims.

What is claimed is:

1. A method of translation of verification commands of an electronic design, comprising the steps of:
   receiving said electronic design;
   receiving at least one analog test harness model having at least one indirect branch contribution statement;
   translating said at least one indirect branch contribution statement into a plurality of direct branch contribution operators based at least in part upon said at least one analog test harness model, said translation having a standardized analog hardware description language; and
   generating a netlist based at least in part upon said translation.

2. The method of translation of said verification commands of said electronic design of claim 1, wherein said standardized analog hardware description language comprises at least of at least one of Verilog-A™ syntax and Verilog-AMS™ syntax.

3. A method of translation of verification commands of an electronic design, comprising the steps of:
   receiving a representation of said electronic design;
   receiving along with said representation of said electronic design, at least one analog test harness model having at least one indirect branch contribution statement and at least one stimulus;
   translating said at least one indirect branch contribution statement into a plurality of direct branch contribution operators based at least in part upon said at least one analog test harness model and said electronic design; and
   generating a netlist based at least in part upon said translation.

4. The method of translation of said verification commands of said electronic design of claim 3, wherein said at least one analog test harness model having at least one stimulus assertion.

5. The method of translation of said verification commands of said electronic design of claim 3, wherein said at least one analog test harness model having at least one output assertion.

6. The method of translation of said verification commands of said electronic design of claim 3, wherein said at least one analog test harness model having at least one output measurement.

7. The method of translation of said verification commands of said electronic design of claim 3, wherein said representation of said electronic design is analog.

8. The method of translation of said verification commands of said electronic design of claim 3, wherein said representation of said electronic design is mixed signal.

9. The method of translation of said verification commands of said electronic design of claim 3, wherein said representation of said electronic design having at least one transistor level circuitry.

10. The method of translation of said verification commands of said electronic design of claim 3, wherein said representation of said electronic design having at least one behavioral modeled circuitry.

11. The method of translation of said verification commands of said electronic design of claim 3, wherein said representation of said electronic design having at least one circuit based upon at least one parasitic model based at least in part upon a physical design.

12. The method of translation of said verification commands of said electronic design of claim 3, wherein said representation of said electronic design having at least one behavioral modeled circuit.

13. A method of translation of verification commands of an electronic design, comprising the steps of:
- receiving a representation of said electronic design;
- receiving at least one analog test harness model having at least one of at least one stimulus, at least one stimulus assertion, at least one of at least one output assertion and at least one output measurement;
- receiving at least one verification subroutine command for said electronic design, said at least one verification subroutine command having at least one indirect branch contribution statement;
- translating said at least one verification subroutine command into corresponding standardized analog hardware description language based at least in part upon said at least one verification subroutine command, said at least one analog test harness model and said electronic design; and
- generating a netlist based at least in part upon said translation.

14. The method of translation of said verification commands of said electronic design of claim 13, wherein said standardized analog hardware description language comprises at least of at least one of Verilog-A™ syntax and Verilog-AMS™ syntax.

15. A method of translation of verification commands of an electronic design, comprising the steps of:
- receiving a representation of said electronic design;
- receiving at least one analog test harness model having at least one of at least one output assertion and at least one output measurement;
- receiving at least one verification subroutine command for said electronic design, said at least one verification subroutine command having at least one indirect branch contribution statement and at least one specification subset;
- translating said at least one verification subroutine command into corresponding at least one of standardized analog hardware description language based at least in part upon said at least one verification subroutine command, said at least one analog test harness model and said electronic design; and
- generating a netlist based at least in part upon said translation.

16. The method of translation of said verification commands of said electronic design of claim 15, wherein said standardized analog hardware description language comprises at least one of Verilog-A™ syntax and Verilog-AMS™ syntax.

17. The method of translation of said verification commands of said electronic design of claim 15, wherein said at least one analog harness model validates said at least one specification subset based at least in part upon said at least one of at least one output assertion and at least one output measurement.

18. The method of translation of said verification commands of said electronic design of claim 15, wherein said at least one specification subset having a data transformation.

19. A non-transitory computer usable medium, said non-transitory computer usable medium having stored thereon a sequence of instructions which, when executed by a processor causes said processor to execute a method of translation of verification commands of an electronic design, said method comprising:
- receiving at least one analog test harness model having at least one of at least one stimulus and at least one stimulus assertion and wherein said at least one analog test harness model having at least one parameterized variable;
- receiving at least one verification subroutine command for said electronic design, said at least one verification subroutine command having at least one indirect branch contribution statement;
- retrieving at least one rule based at least in part on said at least one analog test harness and said at least one verification subroutine command;
- translating said at least one verification subroutine command into corresponding to at least one of standardized analog hardware description language based at least in part upon said at least one verification subroutine command, said retrieved at least one rule, said at least one analog test harness model and said electronic design;
- generating a netlist based at least in part upon said translation;
- electrically simulating at least one subcomponent utilizing at least in part said at least one analog test harness model;
- extracting at least one performance attribute of said electronic design undergoing said electrical simulation;
- comparing said extracted at least one performance attribute and at least one output measurement; and
- fixing said at least one parameterized variable.

20. The non-transitory computer usable medium of claim 19, wherein the method further comprises varying said at least one parameterized variable in at least one separate simulation run.

21. The non-transitory computer usable medium of claim 19, wherein the method further comprises varying said at least one parameterized variable within at least one simulation run.

22. The non-transitory computer usable medium of claim 19, wherein said at least one performance attribute is extracted during said simulation.

23. The non-transitory computer usable medium of claim 19, wherein said at least one performance attribute is extracted after said simulation.

24. The non-transitory computer usable medium of claim 19, wherein said at least one analog test harness model having at least one of at least one output assertion and at least one output measurement.

25. A non-transitory computer usable medium, said non-transitory computer usable medium having stored thereon a sequence of instructions which, when executed by a processor causes said processor to execute a method of translation of verification commands of an electronic design, said method comprising the steps of:
- receiving at least one analog test harness model having at least one of at least one output assertion and at least one output measurement, wherein said at least one analog test harness model having at least one parameterized variable;
- receiving at least one verification subroutine command for said electronic design, said at least one verification subroutine command having at least one indirect branch contribution statement and having at least one specification subset;
- validating said at least one specification subset based at least in part upon said at least one of at least one output assertion and at least one output measurement with said at least one analog harness model;

retrieving at least one rule based at least in part on said at least one analog test harness and said at least one verification subroutine command;

translating said at least one verification subroutine command into corresponding to at least one of standardized analog hardware description language based at least in part upon said at least one verification subroutine command, said retrieved at least one rule, said at least one analog test harness model and said electronic design;

generating a netlist based at least in part upon said translation;

electrically simulating at least one subcomponent utilizing at least in part said at least one analog test harness model;

extracting at least one performance attribute of said electronic design undergoing said electrical simulation; and comparing said extracted at least one performance attribute and said at least one of at least one output assertion and at least one output measurement.

26. The non-transitory computer usable medium of claim 25, wherein said standardized analog hardware description language comprises at least one of Verilog-A™ and Verilog-AMS.

27. The non-transitory computer usable medium of claim 25, wherein the method further comprises modifying said at least one analog test harness model based at least in part upon a designated outcome.

28. The non-transitory computer usable medium of claim 25, wherein the method further comprises modifying said at least one verification subroutine command based at least in part upon a designated outcome.

29. The non-transitory computer usable medium of claim 25, wherein the method further comprises modifying said at least one parameterized variable.

30. The non-transitory computer usable medium of claim 25, wherein said electronic design resulting in at least one of at least one active circuit and at least one passive circuit.

31. The non-transitory computer usable medium of claim 25, wherein said electronic design resulting in at least one active circuit that adjusts at least one of at least one gain and at least one direction of at least one electrical signal.

* * * * *